(12) United States Patent
Xi et al.

(10) Patent No.: US 10,559,274 B2
(45) Date of Patent: Feb. 11, 2020

(54) MULTIPLEXER AND METHOD FOR DRIVING THE SAME

(71) Applicant: AU Optronics Corporation, Hsin-Chu (TW)

(72) Inventors: Peng-Bo Xi, Hsin-Chu (TW); Sung-Yu Su, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 223 days.

(21) Appl. No.: 15/437,589

(22) Filed: Feb. 21, 2017

(65) Prior Publication Data

US 2017/0243559 A1 Aug. 24, 2017

(30) Foreign Application Priority Data

Feb. 22, 2016 (TW) .............................. 105105186 A

(51) Int. Cl.
*G09G 3/00* (2006.01)
*G09G 5/00* (2006.01)
*G09G 3/20* (2006.01)
*G09G 3/36* (2006.01)
*H03K 17/693* (2006.01)
*H03K 17/00* (2006.01)

(52) U.S. Cl.
CPC .............. *G09G 5/003* (2013.01); *G09G 3/006* (2013.01); *G09G 3/20* (2013.01); *G09G 3/3614* (2013.01); *H03K 17/693* (2013.01); G09G 2300/0408 (2013.01); G09G 2300/0452 (2013.01); G09G 2310/0235 (2013.01); G09G 2310/0254 (2013.01); G09G 2310/0291 (2013.01); G09G 2310/0297 (2013.01); G09G 2310/061 (2013.01); H03K 17/002 (2013.01)

(58) Field of Classification Search
CPC ........ G09G 5/003; G09G 3/3614; G09G 3/20; G09G 3/006; G09G 2310/0291; G09G 2310/0235; G09G 2300/0408; G09G 2310/061; G09G 2310/0297; G09G 2310/0254; G09G 2300/0452; H03K 17/693; H03K 17/002
See application file for complete search history.

(56) References Cited

U.S. PATENT DOCUMENTS

2007/0001989 A1* 1/2007 Yoon ..................... G09G 3/3688
345/100
2014/0267218 A1 9/2014 Pai \* cited by examiner

*Primary Examiner* — Patrick N Edouard
*Assistant Examiner* — Joseph P Fox
(74) *Attorney, Agent, or Firm* — WPAT, PC

(57) ABSTRACT

A multiplexer is provided herein. The multiplexer has a plurality of first driving units and a plurality of second driving units. Each of the first driving units has a first data voltage input terminal, and each of the second driving units has a second data voltage input terminal. The first data voltage input terminal and the second data voltage input terminal are configured to receive pixel voltage signals with different polarities. In the first driving unit, a voltage difference between a gate and a drain of a transistor is controlled by a first reset signal, wherein the transistor of the first driving unit is coupled to the first data voltage input terminal and a first data line. In the second driving unit, a voltage difference between a gate and a drain of a transistor is controlled by a second reset signal, wherein the transistor of the second driving unit is coupled to the second data voltage input terminal and a second data line.

11 Claims, 15 Drawing Sheets

MULTIPLEXER AND METHOD FOR DRIVING THE SAME

TECHNICAL FIELD

The present invention relates to a multiplexer and a method for driving the same, and specifically, to a multiplexer comprising single-type transistors and a method for driving the same.

BACKGROUND ART

In the current display panel technology, because a low temperature poly-silicon (LTPS) thin film transistor (TFT) has a high mobility and high reliability, the panel can have a high aperture ratio, and a circuit of a multiplexer can be formed on a substrate, so as to reduce the number of source driver ICs, and satisfy high specification panel design requirements. In addition, during the operation of the panel, because a polarity reversal operation needs to be performed on sub-pixels of the panel, the polarity of a Gamma voltage received by each of the sub-pixels in each frame period may be a positive polarity or a negative polarity. In the case where the polarity reversal operation needs to be performed on the sub-pixels, a traditional multiplexer fabricated by using single-type transistors such as N-type metal-oxide-semiconductor (NMOS) transistors or P-type metal-oxide-semiconductor (PMOS) transistors may have different driving capabilities for the sub-pixels when receiving Gamma voltages of different polarities. Therefore, complementary metal oxide semiconductor (CMOS) transistors are traditionally adopted to produce the multiplexer in a display.

However, compared with a circuit using purely NMOS transistors or PMOS transistors, a circuit using CMOS transistors requires a relatively complicated process and a larger number of masks, causing a significant increase in manufacturing costs of the panels fabricated with the CMOS process, which in turn is less welcome from the consumers' perspective.

SUMMARY OF THE INVENTION

In view of this, the present invention provides a new multiplexer and a method for driving the same, so that the multiplexer has a sufficient driving capability for data lines and sub-pixels no matter whether the multiplexer uses NMOS transistors or PMOS transistors.

One embodiment of the present invention provides a multiplexer. The multiplexer includes a plurality of first driving units and a plurality of second driving units. Each of the first driving units includes a first data voltage input terminal, a first capacitor, a first transistor, and a second transistor. The first data voltage input terminal is configured to receive a first pixel voltage signal. The first capacitor includes a first terminal and a second terminal. The first terminal of the first capacitor is configured to receive a first switch signal. The first transistor includes a first terminal coupled to the second terminal of the first capacitor, a second terminal configured to receive a first reset signal, and a control terminal configured to receive a second switch signal. The first switch signal and the second switch signal have opposite phases. The second transistor first terminal coupled to the first data voltage input terminal a second terminal coupled to a first data line, and a control terminal coupled to the second terminal of the first capacitor. Each of the second driving units includes a second data voltage input terminal, a second capacitor, a third transistor, and a fourth transistor. The second data voltage input terminal is configured to receive a second pixel voltage signal, wherein the second pixel voltage signal and the first pixel voltage signal have opposite polarities. The second capacitor includes a first terminal and a second terminal. The first terminal of the second capacitor is coupled to the first terminal of the first capacitor, and is configured to receive the first switch signal. The third transistor includes a first terminal coupled to the second terminal of the second capacitor, a second terminal configured to receive a second reset signal, and a control terminal coupled to the control terminal of the first transistor to receive the second switch signal. The fourth transistor includes a first terminal coupled to the second data voltage input terminal, a second terminal coupled to a second data line, and a control terminal coupled to the second terminal of the second capacitor. The first reset signal is different from the second reset signal.

One embodiment of the present invention provides a multiplexer. The multiplexer includes a plurality of first driving units and a plurality of second driving units. Each of the first driving units includes a first data voltage input terminal, a first transistor, a second transistor, a third transistor, a fourth transistor, and a first capacitor. The first data voltage input terminal is configured to receive a first pixel voltage signal. The first transistor includes a first terminal, a second terminal, and a control terminal. The first terminal of the first transistor is configured to receive a first system voltage. The control terminal of the first transistor is configured to receive a first switch signal. The second transistor includes a first terminal coupled to the second terminal of the first transistor, a second terminal configured to receive a second system voltage, and a control terminal configured to receive a second switch signal. The first switch signal and the second switch signal have opposite phases. The third transistor includes a first terminal, a second terminal, and a control terminal. The first terminal of the third transistor is coupled to the first data voltage input terminal, and the second terminal of the third transistor is coupled to a first data line. The fourth transistor includes a first terminal coupled to the control terminal of the third transistor, a second terminal configured to receive a first reset signal, and a control terminal configured to receive a second switch signal. The first capacitor includes a first terminal coupled to the second terminal of the first transistor and the first terminal of the second transistor, and a second terminal coupled to the control terminal of the third transistor and the first terminal of the fourth transistor. Each of the second driving units includes a second data voltage input terminal, a fifth transistor, a sixth transistor, a seventh transistor, an eighth transistor, and a second capacitor. The second data voltage input terminal is configured to receive a second pixel voltage signal, wherein the second pixel voltage signal and the first pixel voltage signal have opposite polarities. The fifth transistor includes a first terminal, a second terminal, and a control terminal. The first terminal of the fifth transistor is configured to receive the first system voltage, and the control terminal of the fifth transistor is configured to receive the first switch signal. The sixth transistor includes a first terminal coupled to the second terminal of the fifth transistor, a second terminal configured to receive the second system voltage, and a control terminal configured to receive the second switch signal. The seventh transistor includes a first terminal, a second terminal, and a control terminal. The first terminal of the seventh transistor is coupled to the second data voltage input terminal. The second terminal of the seventh transistor is coupled to the second data line. The eighth transistor includes a first terminal coupled to the control terminal of the seventh transistor, a second terminal configured to receive the second reset signal, and a control terminal configured to receive the second switch signal. The second capacitor includes a first terminal coupled to the second terminal of the fifth transistor and the first terminal of the sixth transistor, and a second terminal coupled to the control terminal of the seventh transistor and the first terminal of the eighth transistor. The first reset signal is different from the second reset signal.

One embodiment of the present invention provides a method for driving the multiplexer described above. The multiplexer is used in a display, and all the transistors of the first driving unit and the second driving unit are N-type metal-oxide-semiconductor transistors. The method includes: during the $n^{th}$ frame period of the display, making the first pixel voltage signal to have a first polarity; making the second pixel voltage signal to have a second polarity; making the first reset signal to have an electric potential at a first rest level; and making the second reset signal to have an electric potential at a second reset level; wherein n is a positive integer, the first polarity is different from the second polarity, and the second reset level is higher than the first reset level; and during the $(n+1)^{th}$ frame period of the display, making the first pixel voltage signal to have the second polarity, making the second pixel voltage signal to have the first polarity, making the first reset signal to have the electric potential at the second reset level, and making the second reset signal to have the electric potential at the first reset level.

One embodiment of the present invention provides a method for driving the multiplexer described above. The multiplexer is used in a display, and all the transistors of the first driving unit and the second driving unit are P-type metal-oxide-semiconductor transistors. The method includes: during the $n^{th}$ frame period of the display, making the first pixel voltage signal to have a first polarity; making the second pixel voltage signal to have a second polarity; making the first reset signal to have an electric potential at a first reset level; and making the second reset signal to have an electric potential at a second reset level; wherein n is a positive integer, the first polarity is different from the second polarity, and the second reset level is higher than the first reset level; and during the $(n+1)^{th}$ frame period of the display, making the first pixel voltage signal to have the second polarity, making the second pixel voltage signal to have the first polarity, making the first reset signal to have the electric potential at the second reset level, and making the second reset signal to have the electric potential at the first reset level.

Through the embodiments of the present invention, two different reset signals are applied to the multiplexer to increase an absolute value of a voltage difference between a gate and a drain of a transistor for driving a data line, thereby strengthening the driving capability of the transistor. In this way, no matter whether the transistors of the multiplexer are NMOS transistors or PMOS transistors, the multiplexer has a sufficient driving capability for data lines and sub-pixels. Therefore, all the transistors of the multiplexer can either be N-type metal-oxide-semiconductor transistors or P-type metal-oxide-semiconductor transistors, thereby simplifying the process of manufacturing the multiplexer and/or a panel and improving the competitiveness of products thereof.

BRIEF DESCRIPTIONS OF THE DRAWINGS

DETAILED DESCRIPTIONS OF THE INVENTION

Figure 1:
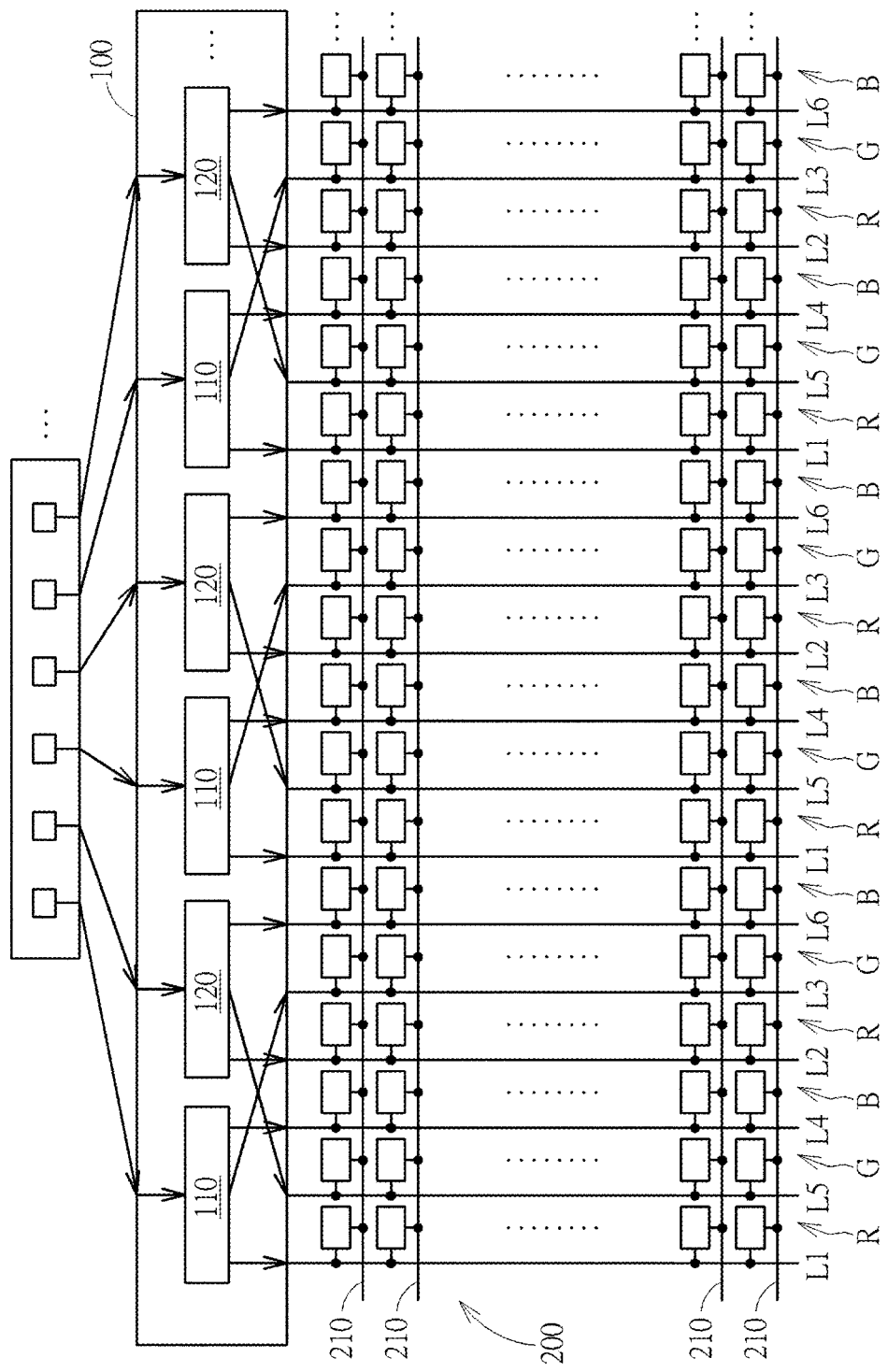
FIG. 1 is a schematic diagram of a multiplexer applied to a display according to an embodiment of the present invention.

Please refer to FIG. 1. FIG. 1 is a schematic view of a multiplexer 100 applied to a display 200 according to an embodiment of the present invention. The display 200 includes the multiplexer 100, red sub-pixels R arranged in multiple columns, green sub-pixels G arranged in multiple columns, and blue sub-pixels B arranged in multiple columns, a plurality of gate lines 210, and a plurality of data lines 220. Each red sub-pixel R, each green sub-pixel G, and each blue sub-pixel B are coupled to a corresponding gate line 210 and a corresponding data line 220. The multiplexer 100 includes a plurality of driving units 110 and a plurality of driving units 120. The display 200 may be a liquid crystal display, an electroluminescent display, electrowetting display, or any other types of display.

Figure 2:
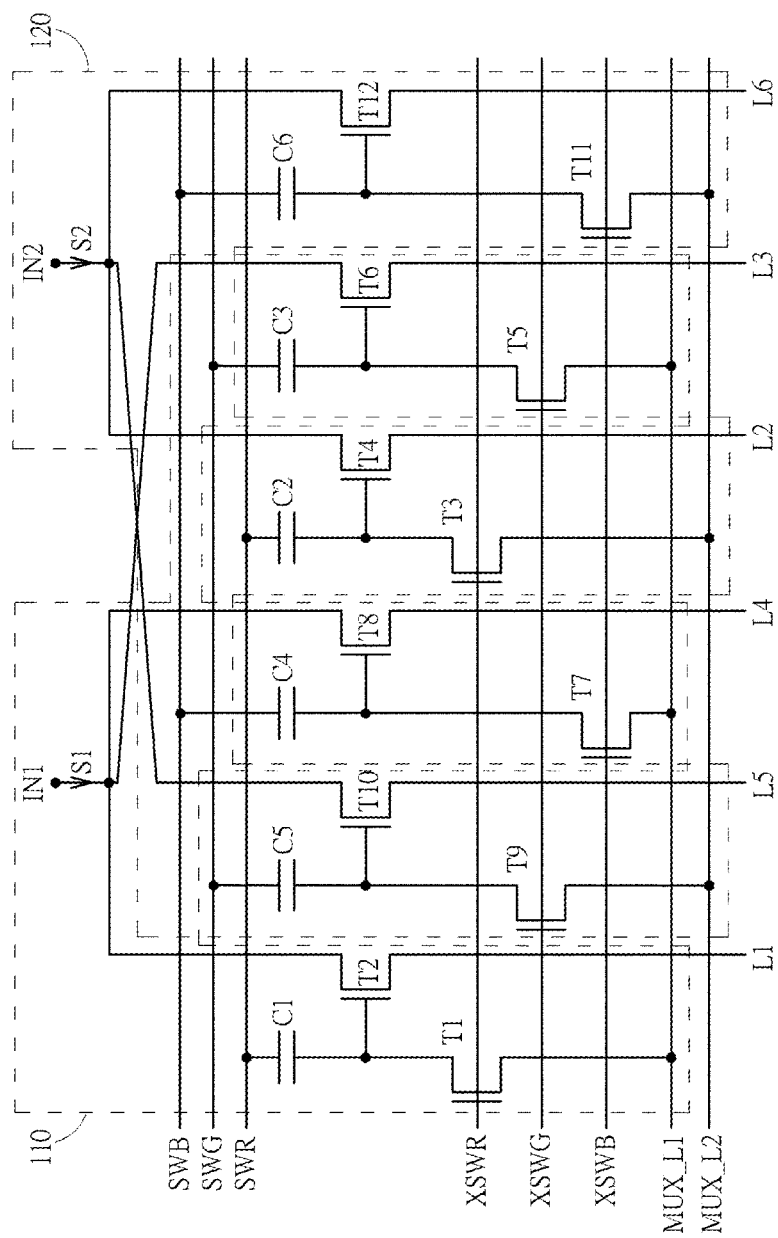
FIG. 2 is a circuit diagram of two driving units for implementing the multiplexer in FIG. 1 according to an embodiment of the present invention.
Figure 3:
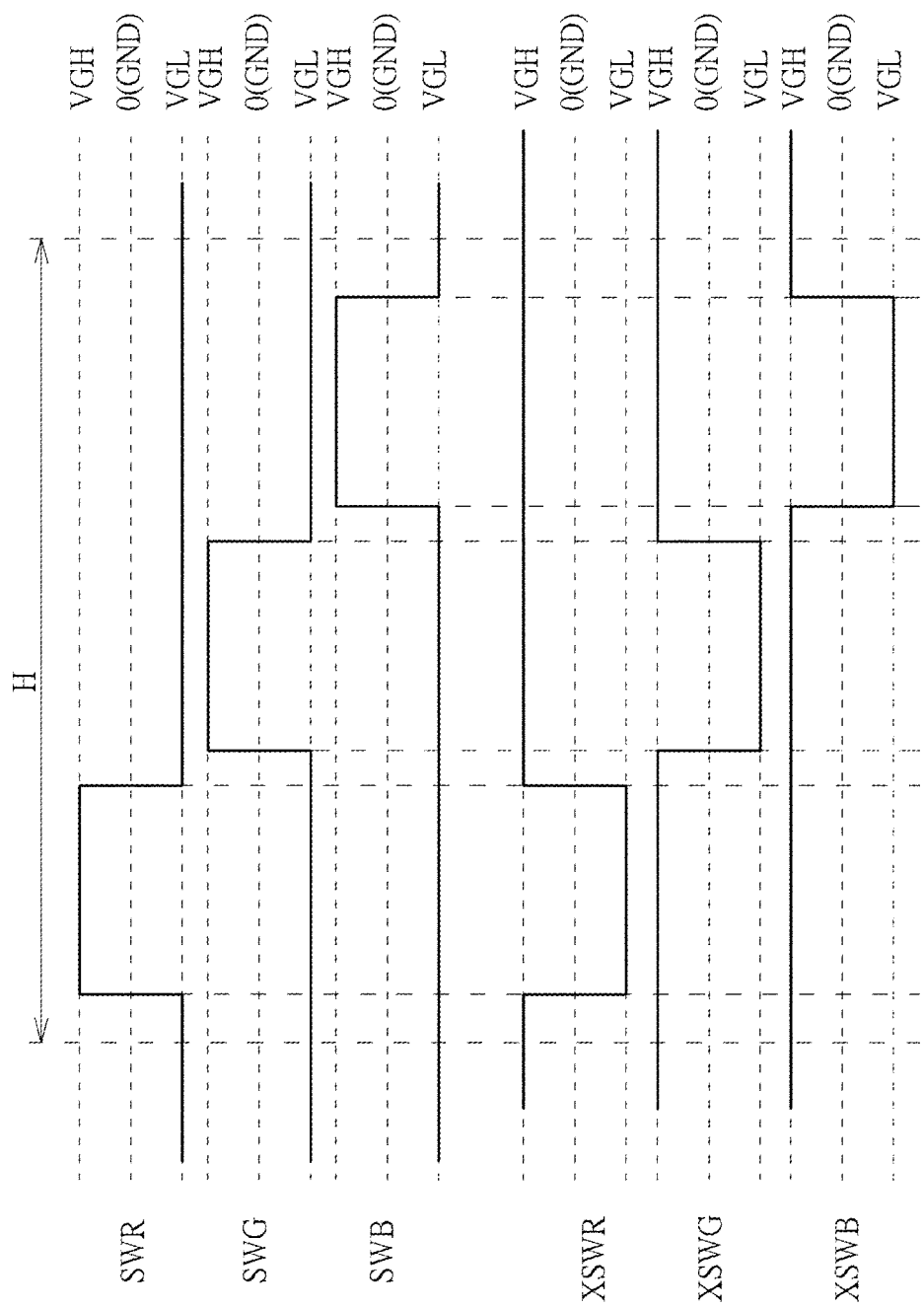
FIG. 3 is a timing diagram of switch signals SWR, SWG, SWB, XSWR, XSWG, and XSWB in FIG. 2.

Please refer to FIG. 2. FIG. 2 is a circuit diagram of two driving units 110 and 120 for implementing the multiplexer in FIG. 1 according to an embodiment of the present invention. Each driving unit 110 includes a data voltage input terminal IN1, a capacitor C1, a transistor T1, and a transistor T2. The data voltage input terminal IN1 is configured to receive a pixel voltage signal S1. The capacitor C1 includes a first terminal and a second terminal, wherein the first terminal of the capacitor C1 is configured to receive a switch signal SWR. The transistor T1 includes a first terminal coupled to the second terminal of the capacitor C1, a second terminal configured to receive a reset signal MUX_L1, and a control terminal configured to receive a switch signal XSWR. Each driving unit 120 includes a data voltage input terminal IN2, a capacitor C2, a transistor T3, and a transistor T4. The data voltage input terminal IN2 is configured to receive a pixel voltage signal S2. The capacitor C2 includes a first terminal and a second terminal, wherein the first terminal of the capacitor C2 is configured to receive the switch signal SWR. The transistor T3 includes a first terminal coupled to the second terminal of the capacitor C1, a second terminal configured to receive a reset signal MUX_L2, and a control terminal configured to receive the switch signal XSWR. The reset signal MUX_L1 is different from the reset signal MUX_L2. The switch signal SWR and the switch signal XSWR have opposite phases. As shown in FIG. 3, the switch signals SWR and XSWR are the respective square waves having electric potentials switched between a gate high potential VGH and a gate low potential VGL, and the two signals have opposite phases. The transistor T2 includes a first terminal coupled to the data voltage input terminal T1, a second terminal coupled to a data line L1, and a control terminal coupled to the second terminal of the capacitor C1. In addition, the data voltage input terminal IN2 is configured to receive a pixel voltage signal S2, wherein the pixel voltage signal S2 and the pixel voltage signals S1 have opposite polarities. In other words, when the pixel voltage signal S1 has a positive polarity, the pixel voltage signal S2 has a negative polarity; and when the pixel voltage signal S1 has a negative polarity, the pixel voltage signal S2 has a positive polarity. The transistor T4 includes a first terminal coupled to the data voltage input terminal IN2, a second terminal coupled to a data line L2, and a control terminal coupled to the second terminal of the capacitor C2. In this embodiment, the transistors T1 to T4 are all N-type metal-oxide-semiconductor (NMOS) transistors.

Please refer to FIG. 2 to FIG. 3. FIG. 3 is a timing diagram of switch signals SWR, SWG, SWB, XSWR, XSWG, and XSWB in FIG. 2. As shown in FIG. 3, at intervals of a scan period H, the switch signal SWR is switched from a gate low potential VGL to a gate high potential VGH, and then is switched back from the gate high potential VGH to the gate low potential VGL. Similarly, at intervals of the scan period H, the switch signal XSWR is switched from the gate high potential VGH to the gate low potential VGL, and then is switched back from the gate low potential VGL to the gate high potential VGH. Therefore, the switch signal SWR and the switch signal XSWR have opposite phases. The scan period H is associated with a frame rate of the display 200 and the total number of gate lines 210. Assuming that the frame rate of the display 200 is M frames per second and the total number of the gate lines 210 of the display 200 is N, each scan period H is equal to 1/(M×N) seconds, and the switch signals SWR, SWG, SWB, XSWR, XSWG, and XSWB generate N waveforms as shown in FIG. 3 in each frame period of the display 200; each scan period H corresponds to a scan time of one gate line 210.

Figure 4:
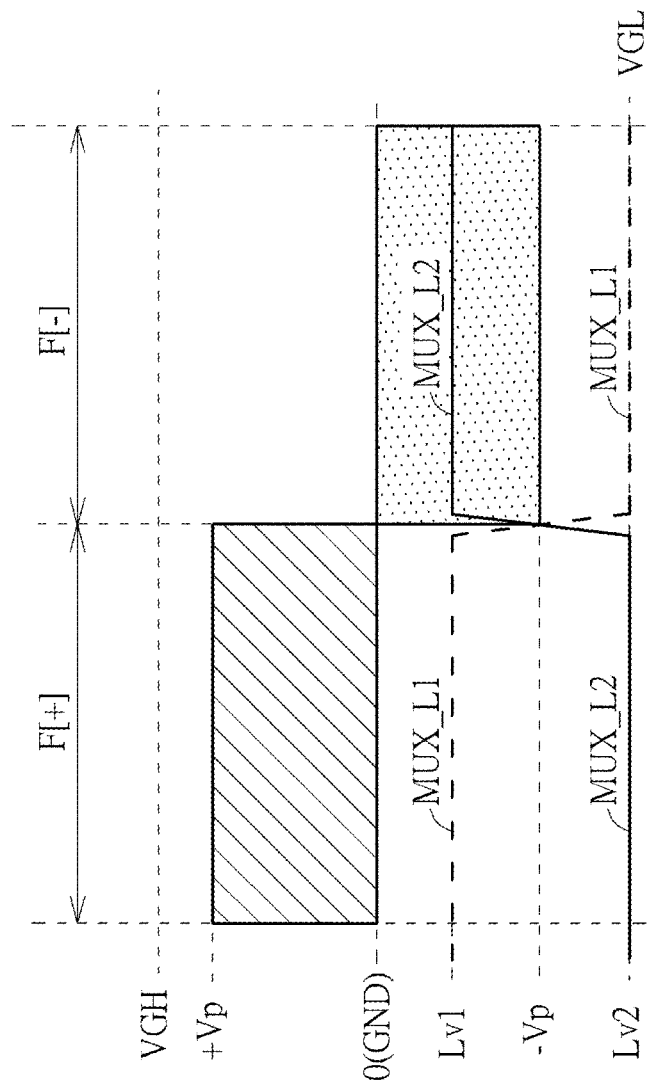
FIG. 4 is a timing diagram of a reset signal MUX_L1 and a reset signal MUX_L2 in FIG. 2.
Figure 5:
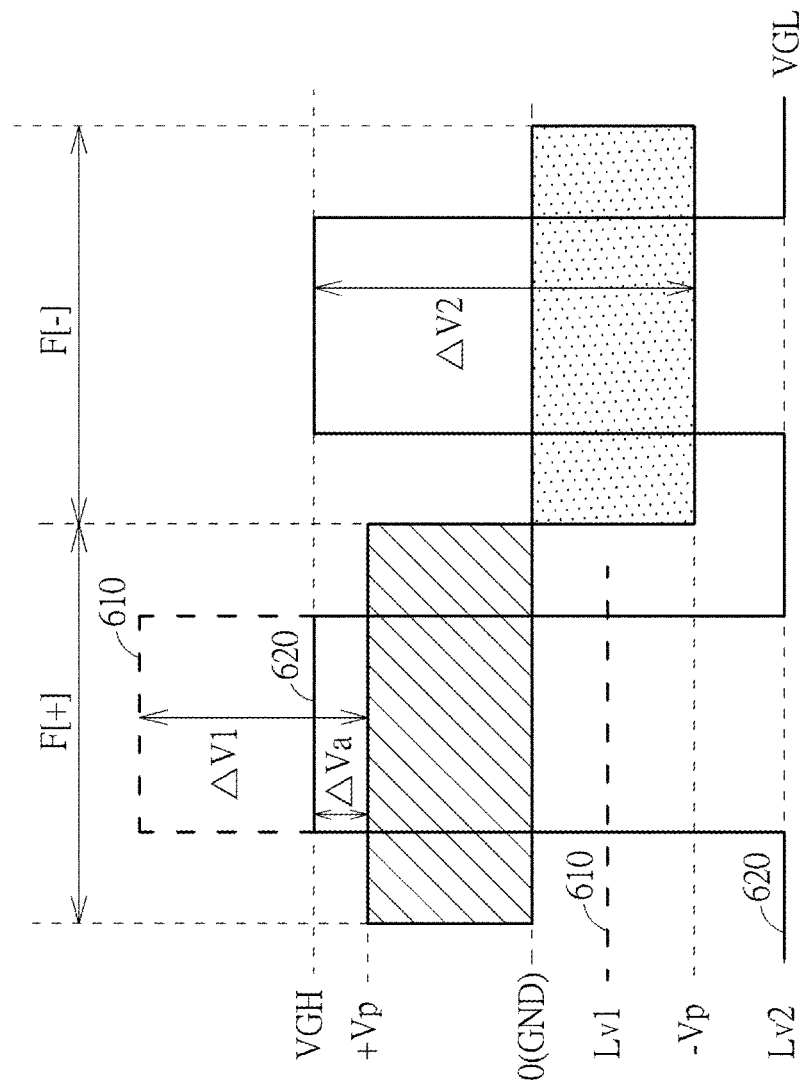
FIG. 5 is a timing diagram of electric potentials of gates of the transistors T2 and T4 in FIG. 2.

Please refer to FIG. 2 to FIG. 5. FIG. 4 is a timing diagram of a reset signal MUX_L1 and a reset signal MUX_L2 in FIG. 2, and FIG. 5 is a timing diagram of electric potentials of gates of the transistors T2 and T4 in FIG. 2. FIG. 4 and FIG. 5 show two frame periods F[+] and F[−] of the display 200, wherein the frame period F[+] represents that the pixel voltage signal S1 or S2 applied to a certain sub-pixel of the display 200 during the frame period F[+] has a positive polarity, and the frame period F[−] represents that the pixel voltage signal S1 or S2 applied to a certain sub-pixel of the display 200 during the frame period F[−] has a negative polarity. For ease of description, sub-pixels coupled to the data lines L1 and L2 in FIG. 2 are taken as an example for illustration. Whether the sub-pixel coupled to the data line L1 receives the pixel voltage signal S1 from the data voltage input terminal IN1 depterminals on whether the transistor T2 is turned on; and whether the transistor T2 is turned on depterminals on a bias of a gate of the transistor T2. When the switch signal SWR is at the gate low potential VGL and the switch signal XSWR is at the gate high potential VGH, because the transistor T1 is turned on, the electric potential of the gate of the transistor T2 is pulled down to the electric potential of the reset signal MUX_L1, such that the transistor T2 is turned off; and the electrical connection between the data voltage input terminal IN1 and the data line L1 is cut off. In this case, the pixel voltage signal S1 will not be transmitted to the data line L1. On the contrary, when the switch signal SWR is at the gate high potential VGH and the switch signal XSWR is at the gate low potential VGL, the transistor T1 is not turned on, and the gate high potential VGH of the switch signal SWR is applied to the gate of the transistor T2 via a capacitor C1, such that the transistor T2 is turned on. In this case, the electrical connection between the data voltage input terminal IN1 and the data line L1 is established, such that the pixel voltage signal S1 is transmitted to the data line L1. Similarly, whether the sub-pixel coupled to the data line L2 receives the pixel voltage signal S2 from the data voltage input terminal IN2 depterminals on whether the transistor T4 is turned on, and whether the transistor T4 is turned on depterminals on the bias of the gate of the transistor T2. When the switch signal SWR is at the gate low potential VGL and the switch signal XSWR is at the gate high potential VGH, because the transistor T3 is turned on, the electric potential of the gate of the transistor T4 is pulled down to the electric potential of the reset signal MUX_L2, such that the transistor T4 is turned off, and the electrical connection between the data voltage input terminal IN2 and the data line L2 is cut off. In this case, the pixel voltage signal S2 will not be transmitted to the data line L2. On the other hand, when the switch signal SWR is at the gate high potential VGH and the switch signal XSWR is at the gate low potential VGL, the transistor T3 is not turned on, and the gate high potential VGH of the switch signal SWR is applied to the gate of the transistor T4 via the capacitor C2, such that the transistor T4 is turned on. In this case, the electrical connection between the data voltage input terminal IN2 and the data line L2 is established, such that the pixel voltage signal S2 is transmitted to the data line L2.

In addition, the waveforms of the switch signals SWR, SWG, SWB, XSWR, XSWG, and XSWB, for example, are not associated with the polarities of the sub-pixels. In other words, the waveforms of the switch signals SWR, SWG, SWB, XSWR, XSWG, and XSWB remain unchanged in different frame periods F[+] and F[−]. However, the electric potential of the reset signal MUX_L1, the electric potential of the reset signal MUX_L2, the electric potential of the pixel voltage signal S2, and the electric potential of the pixel voltage signal S2 are associated with the polarities of the sub-pixels. For ease of description, it is assumed that the electric potentials of the pixel voltage signal S1 during the frame periods F[+] and F[−] are equal to a positive polarity pixel voltage +Vp and a negative polarity pixel voltage −Vp respectively; and the electric potentials of the pixel voltage signal S2 during the frame periods F[+] and F[−] are equal to the negative polarity pixel voltage −Vp and the positive polarity pixel voltage +Vp respectively, wherein Vp is greater than zero. In addition, as shown in FIG. 4, within the frame period F[+], the electric potential of the reset signal MUX_L1 is equal to a reset level Lv1, and the electric potential of the reset signal MUX_L2 is equal to a reset level Lv2; and within the frame period F[−], the electric potential of the reset signal MUX_L1 is equal to the reset level Lv2, and the electric potential of the reset signal MUX_L2 is equal to the reset level Lv1, wherein the reset level Lv2 is lower than the reset level Lv1. The setting principle of the reset levels Lv1 and Lv2 is to smoothly turn off the transistor T2 when the transistor T1 is turned on, and to smoothly turn off the transistor T4 when the transistor T3 is turned on. Therefore, the setting of the reset levels Lv1 and Lv2 is associated with the electric potentials of the voltage input terminals IN1 and IN2. Specifically, when the transistor T1 is turned on and in order for the transistor T2 not to be turned on, the electric potential of the voltage input terminal IN1 needs to be higher than the electric potential of the MUX_L1. To this terminal, in the frame period F[+], the electric potential of the reset signal MUX_L1, equal to the reset level Lv1, needs to be lower than the electric potential of the voltage input terminal IN1 (that is, the electric potential of the pixel voltage signal S1); and in the frame period F[−], the electric potential of the reset signal MUX_L1, equal to the reset level Lv2, also needs to be lower than the electric potential of the voltage input terminal IN1. In other words, assuming that the minimum electric potentials of the pixel voltage signal S1 in the frame period F[+] and the frame period F[−] are 0 V and −5 V respectively, the reset levels Lv1 and Lv2 can be set to voltages below 0 V and −5 V respectively (for example, voltages of −1 V and −6 V). Similarly, when the transistor T3 is turned on and in order for the transistor T4 not to be turned on, the electric potential of the voltage input terminal IN2 needs to be higher than the electric potential of the MUX_L2. To this terminal, in the frame period F[+], the electric potential of the reset signal MUX_L2, equal to the reset level Lv2, needs to be lower than the electric potential of the voltage input terminal IN2 (that is, the electric potential of the pixel voltage signal S2); and in the frame period F[−], the electric potential of the reset signal MUX_L2, equal to the reset level Lv1, also needs to be lower than the electric potential of the voltage input terminal IN2. In other words, assuming that the minimum electric potentials of the pixel voltage signal S2 in the frame period F[−] and the frame period F[+] are 0 V and −5 V respectively, the reset levels Lv1 and Lv2 can be set to voltages below 0 V and −5 V respectively (for example, voltages of −1 V and −6 V), consistent with the above inference. In this embodiment, the reset level Lv2 is the gate low potential VGL. In another embodiment of the present invention, the reset level Lv1 is lower than a ground potential GND (that is, 0 V). In another embodiment of the present invention, a voltage difference between the ground potential GND and the reset level MUX_L1 is equal to a preset voltage difference, and the preset voltage difference is between Vth+0.5 V and Vth−0.5 V, wherein Vth is an average value of threshold voltages of all the transistors in the driving units 110 and 120. According to another embodiment of the present invention, the preset voltage difference may also be a threshold voltage of the transistor T2 or the transistor T4.

During, the frame period F[+], when the electric potential of the switch signal SWR is equal to the gate low potential VGL, and the electric potential of the switch signal XSWR is equal to the gate high potential VGH, the transistors T1 and T3 are both turned on, such that the reset signals MUX_L1 and MUX_L2 are transmitted to the gates of the transistors T2 and T4 respectively. In this case, because the electric potentials of the reset signals MUX_L1 and MUX_L2 are the reset levels Lv1 and Lv2 respectively, biases of the reset levels Lv1 and Lv2 are applied to the respective gates of the transistors T2 and T4, so that the transistors T2 and T4 are not turned on. In this case, the voltage differences between the two terminals of the capacitor C1 and between the two terminals of the capacitor C2 are (VGL−Lv1) and (VGL−Lv2) respectively. In FIG. 5, changes in the electric potentials of the gates of the transistors T2 and T4 during the frame period F[+] are presented through the respective curves 610 and 620. In addition, during the frame period F[+], when the electric potential of the switch signal SWR is equal to the gate high potential VGH, and the electric potential of the switch signal XSWR is equal to the gate low potential VGL, the transistors T1 and T3 are not turned on; yet the electric potential of the gate of the transistor T2 is increased to about (Lv1+VGH−VGL) because of the coupling effect of the capacitor C1, and the electric potential of the gate of the transistor T4 is increased to about (Lv2+VGH−VGL) because of the coupling effect of the capacitor C2. As a result, the transistors T2 and T4 are both turned on and the pixel voltage signals S1 and S2 are transmitted to the data lines L1 and L2 respectively; and the electric potentials of the data lines L1 and L2 are the positive polarity pixel voltage +Vp and the negative polarity pixel voltage −Vp respectively. It is clear from the above description that when the transistors T2 and T4 are turned on because of the coupling effect of the capacitors C1 and C2, the voltage differences between the gate of the transistor T2 and the data line L1 and between the gate of the transistor T4 and the data line L2 are (Lv1+VGH−VGL−Vp) and (Lv2+VGH−VGL+Vp) respectively. (Lv1+VGH−VGL−Vp) is equal to the voltage difference ΔV1 shown in FIG. 5; and in the case where the reset level Lv2 is equal to the gate low potential VGL, (Lv2+VGH−VGL+Vp) is equal to (VGH+Vp) and is also equal to the voltage difference ΔV2. Therefore, when the transistors T2 and T4 are turned on during the frame period F[+], the voltage differences between the gate and the drain of the transistor T2 and between the gate and the drain of the transistor T4 are equal to the voltage differences ΔV1 and ΔV2 respectively. In comparison, if the switch signal SWR is directly transmitted to the gates of the transistors T2 and T4 without the coupling effect of the capacitors C1 and C2, when the transistor T2 is turned on, the voltage difference between the gate of the transistor T2 and the data line L1 is only (VGH−Vp) (that is, ΔVa) during the frame period F[+], far less than the above (Lv1+VGH−VGL−Vp) (i.e., ΔV1). In other words, in this embodiment, the voltage difference ΔV1 between the gate of the transistor T2 and the data line L1 is greater than the voltage difference ΔVa generated in a traditional driving manner; therefore, with the circuit structure and the driving manner of the above embodiment of the present invention, the transistors T1 to T4 still have sufficient driving capabilities for the data lines and the sub-pixels in the case when the transistors T1 to T4 are all NMOS transistors.

Similarly, during the frame period F[−], when the electric potential of the switch signal SWR is equal to the gate low potential VGL, and the electric potential of the switch signal XSWR is equal to the gate high potential VGH, the transistors T1 and T3 are both turned on, such that the reset signals MUX_L1 and MUX_L2 are transmitted to the gates of the transistors T2 and T4 respectively. In this case, because the electric potentials of the reset signals MUX_L1 and MUX_L2 are the reset levels Lv2 and Lv1 respectively, biases of the reset levels Lv2 and Lv1 are applied to the respective gates of the transistors T2 and T4, so that the transistors T2 and T4 are not turned on. In this case, voltage drops between the two terminals of the capacitor C1 and between the two terminals of the capacitor C2 are (VGL−Lv2) and (VGL−Lv1) respectively. In addition, during the frame period F[+], when the electric potential of the switch signal SWR is equal to the gate high potential VGH, and the electric potential of the switch signal XSWR is equal to the gate low potential VGL, the transistors T1 and T3 are not turned on; yet the electric potential of the gate of the transistor T2 is increased to (Lv2+VGH−VGL) because of the coupling effect of the capacitor C1, and the electric potential of the gate of the transistor T4 is increased to (Lv1+VGH−VGL) because of the coupling effect of the capacitor C2. As a result, the transistors T2 and T4 are both turned on and the pixel voltage signals S1 and S2 are transmitted to the data lines L1 and L2 respectively; and the electric potentials of the data lines L1 and L2 are the negative polarity pixel voltage +Vp and the positive polarity pixel voltage −Vp respectively. It is clear from the above description that when the transistors T2 and T4 are turned on because of the coupling effect of the capacitors C1 and C2, the voltage differences between the gate of the transistor T2 and the data line L1 and between the gate of the transistor T4 and the data line L2 are (Lv2+VGH−VGL−Vp) and (Lv1+VGH−VGL−Vp) respectively. (Lv1+VGH−VGL−Vp) is equal to the voltage difference ΔV1 shown in FIG. 5; and in the case where the reset level Lv2 is equal to the gate low potential VGL, (Lv2+VGH−VGL+Vp) is equal to (VGH+Vp) and is also equal to the voltage difference ΔV2. Therefore, when the transistors T2 and T4 are turned on during the frame period F[−], the voltage differences between the gate and the drain of the transistor T2 and between the gate and the drain of the transistor T4 are equal to the voltage differences ΔV2 and ΔV1 respectively. In comparison, if the switch signal SWR is directly transmitted to the gates of the transistors T2 and T4 without the coupling effect of the capacitors C1 and C2, when the transistor T4 is turned on, the voltage difference between the gate of the transistor T4 and the data line L2 is only (VGH−Vp) (i.e., ΔVa) during the frame period F[−], far less than the above (Lv1+VGH−VGL−Vp) (i.e., ΔV1). In other words, in this embodiment, the voltage difference ΔV1 between the gate of the transistor T4 and the data line L2 is far greater than the voltage difference ΔVa generated in a traditional driving manner; therefore, with the circuit structure and the driving manner of the above embodiment of the present invention, the transistors T1 to T4 still have sufficient driving capabilities for the data lines and the sub-pixels in the case when the transistors T1 to T4 are all NMOS transistors.

Please refer to FIG. 2 and FIG. 3 again. In another embodiment of the present invention, each driving unit 110 may further include a capacitor C3, a transistor T5, a transistor T6, a capacitor C4, a transistor T7, and a transistor T8; and each driving unit 120 may further include a capacitor C5, a transistor T9, a transistor T10, a capacitor C6, a transistor T11, and a transistor T12. The capacitor C3 includes a first terminal and a second terminal, wherein the first terminal of the capacitor C3 is configured to receive the switch signal SWG. The transistor T5 includes a first terminal coupled to the second terminal of the third capacitor C3, a second terminal configured to receive the reset signal MUX_L1, and a control terminal configured to receive the switch signal XSWG. The switch signal SWG and the switch signal XSWG have opposite phases. The transistor 16 includes a first terminal coupled to the data voltage input terminal IN1, a control terminal coupled to the second terminal of the capacitor C3, and a second terminal coupled to a data line L3. The capacitor C4 includes a first terminal and a second terminal, wherein the first terminal of the capacitor C4 is configured to receive the switch signal SWB. The transistor T7 includes a first terminal coupled to the second terminal of the capacitor C4, a second terminal configured to receive the reset signal MUX_L1, and a control terminal configured to receive the switch signal XSWB. The switch signal SWB and the switch signal XSWB have opposite phases. The transistor T8 includes a first terminal coupled to the data voltage input terminal IN1, a control terminal coupled to the second terminal of the capacitor C4, and a second terminal coupled to a data line L4. The capacitor C5 includes a first terminal and a second terminal, wherein the first terminal of the capacitor C5 is coupled to the first terminal of the capacitor C3, and is configured to receive the switch signal SWG. The transistor T9 includes a first terminal coupled to the second terminal of the capacitor C5, a second terminal configured to receive the reset signal MUX_L2, and a control terminal coupled to the control terminal of the transistor T5 to receive the switch signal XSWG. The transistor T10 includes a first terminal coupled to the data voltage input terminal IN2, a control terminal coupled to the second terminal of the capacitor C5, and a second terminal coupled to a data line L5. The capacitor C6 includes a first terminal and a second terminal, wherein the first terminal the capacitor C6 is coupled to the first terminal of the capacitor C4, and is configured to receive the switch signal SWB. The transistor T11 includes a first terminal coupled to the second terminal of the capacitor C6, a second terminal configured to receive the reset signal MUX_L2, and a control terminal coupled to the control terminal of the transistor T7 to receive the switch signal XSWB. The transistor T12 includes a first terminal coupled to the data voltage input terminal IN2, a control terminal coupled to the second terminal of the capacitor C6, and a second terminal coupled to a data line L6.

In this embodiment, the transistors T1 to T12 are all NMOS transistors. The operation manner of the capacitor C3, the transistor T5, and the transistor T6 of the driving unit 110 is similar to that of the capacitor C1, the transistor T1, and the transistor T2; and the operation manner of the capacitor C5, the transistor T9, and the transistor T10 of the driving unit 120 is similar to that of the capacitor C2, the transistor T3, and the transistor T4. What is different is that the operations of the capacitor C1, the transistor T1, and the transistor T2 and the operations of the capacitor C2, the transistor T3, and the transistor T4 are controlled by the switch signals SWR and XSWR, whereas the operations of the capacitor C3, the transistor T5, and the transistor T6 and the operations of the capacitor C5, the transistor T9, and the transistor T10 are controlled by the switch signals SWG and XSWG instead. The rest of the operation manners remain the same. As shown in FIG. 3, the switch signals SWG and XSWG merely slightly lag behind the switch signals SWR and XSWR in terms of the time sequence, and the switch signals SWR and SWG are the gate high potential VGH at different times. Therefore, both the operation manners of the capacitor C3, the transistor T5, and the transistor T6 of the driving unit 110, and of the capacitor C5, the transistor T9, and the transistor T10 of the driving unit 120 can be inferred by referring to the aforementioned operation manner of the capacitor C1, the transistor T1, and the transistor T2, and the aforementioned operation manner of the capacitor C2, the transistor T3, and the transistor T4. Details are not described again herein.

Likewise, the operation manner of the capacitor C4, the transistor T7, and the transistor T8 of the driving unit 110 is similar to that of the capacitor C1, the transistor T1, and the transistor T2; and the operation manner of the capacitor C6, the transistor T11, and the transistor T12 of the driving unit 120 is similar to that of the capacitor C2, the transistor T3, and the transistor T4. What is different is that the operations of the capacitor C1, the transistor T1, and the transistor T2 and the operations of the capacitor C2, the transistor T3, and the transistor T4 are controlled by the switch signals SWR and XSWR, whereas the operations of the capacitor C4, the transistor T7, and the transistor T8 and the operations of the capacitor C6, the transistor T11, and the transistor T12 are controlled by the switch signals SWB and XSWB instead. The rest of the operation manners remain the same. As shown in FIG. 3, the switch signals SWB and XSWB merely slightly lag behind the switch signals SWR and XSWR in terms of the time sequence, and the switch signals SWR, SWG, and SWB are the gate high potential VGH at different times. Thus, both the operation manners of the capacitor C4, the transistor T7, and the transistor T8 of the driving unit 110, and of the capacitor C6, the transistor T11, and the transistor T12 of the driving unit 120 can be inferred by referring to the aforementioned operation manner of the capacitor C1, the transistor T1, and the transistor T2 and the aforementioned operation manner of the capacitor C2, the transistor T3, and the transistor T4. Details are not described again herein.

In an embodiment of the present invention, the data lines L1, L2, L3, L4, L5, and L6 are coupled to the sub-pixels including a red sub-pixel R, a green sub-pixel G, a blue sub pixel B, a red sub-pixel R, a green sub pixel G, and a blue sub-pixel B respectively. Because the pixel voltage signals S1 and S2 received by the data voltage input terminals IN1 and IN2 have different polarities, the display 200 is driven in a column inversion manner through the above circuit structure and connection manner.

Figure 6:
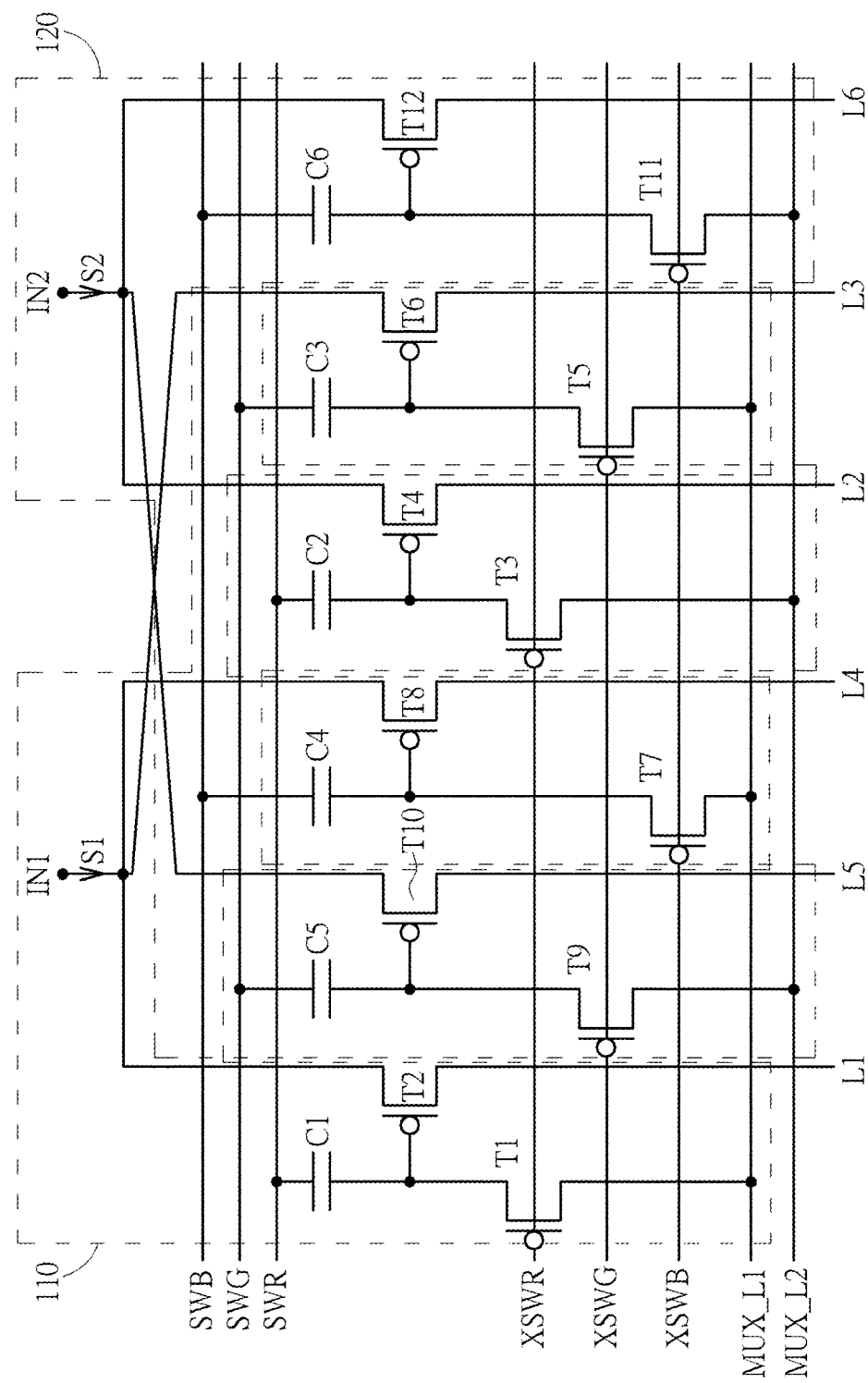
FIG. 6 is a circuit diagram of two driving units for implementing the multiplexer in FIG. 1 according to another embodiment of the present invention.
Figure 7:
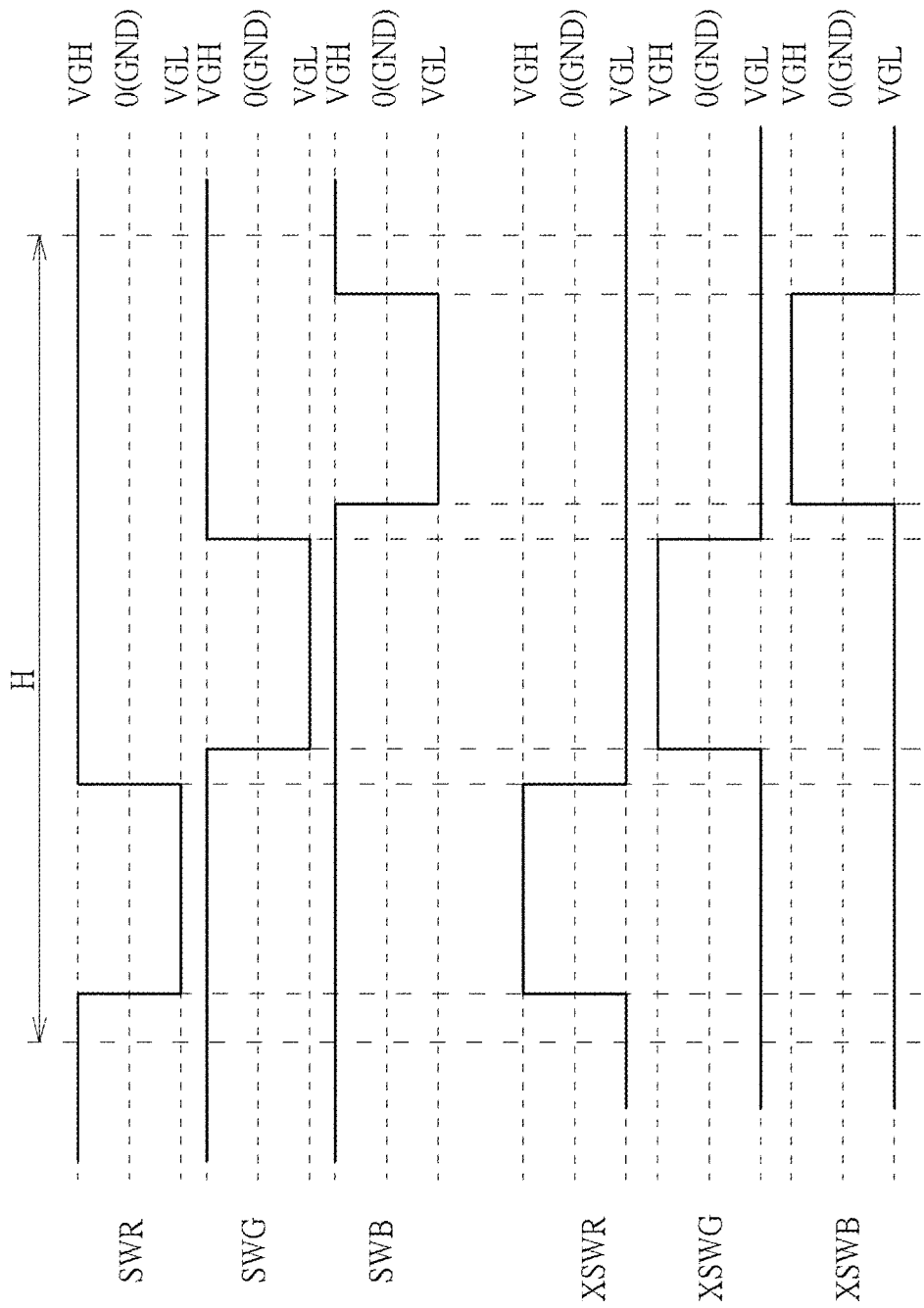
FIG. 7 is a timing diagram of switch signals SWR, SWG, SWB, XSWR, XSWG, and XSWB in FIG. 6.
Figure 8:
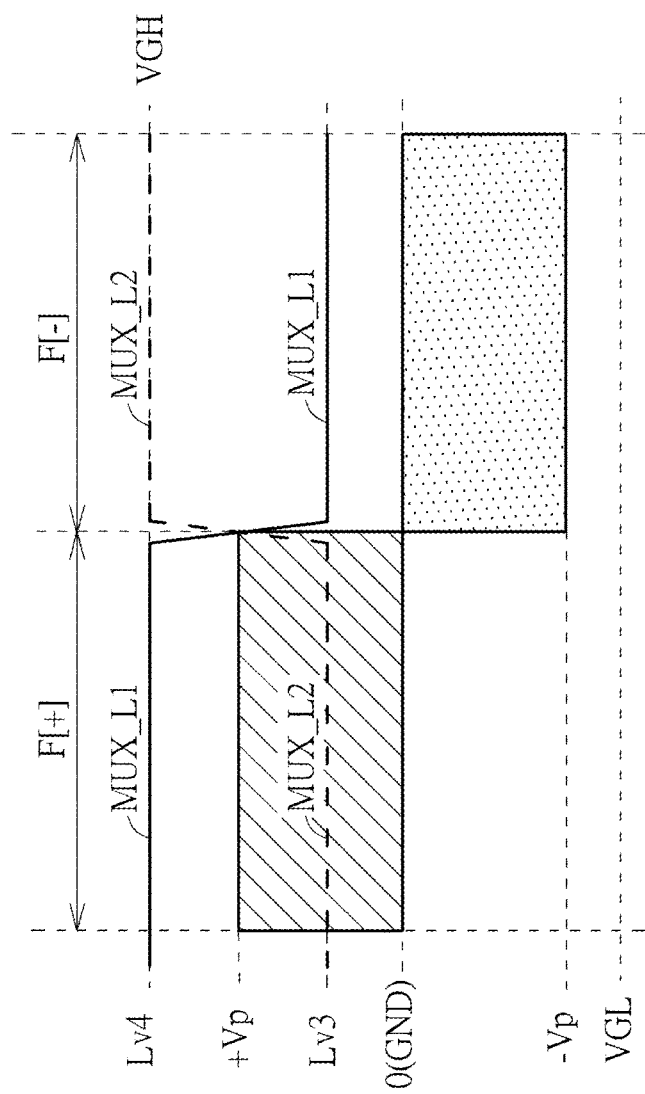
FIG. 8 is a timing diagram of a reset signal MUX_L1 and a reset signal MUX_L2 in FIG. 6.
Figure 9:
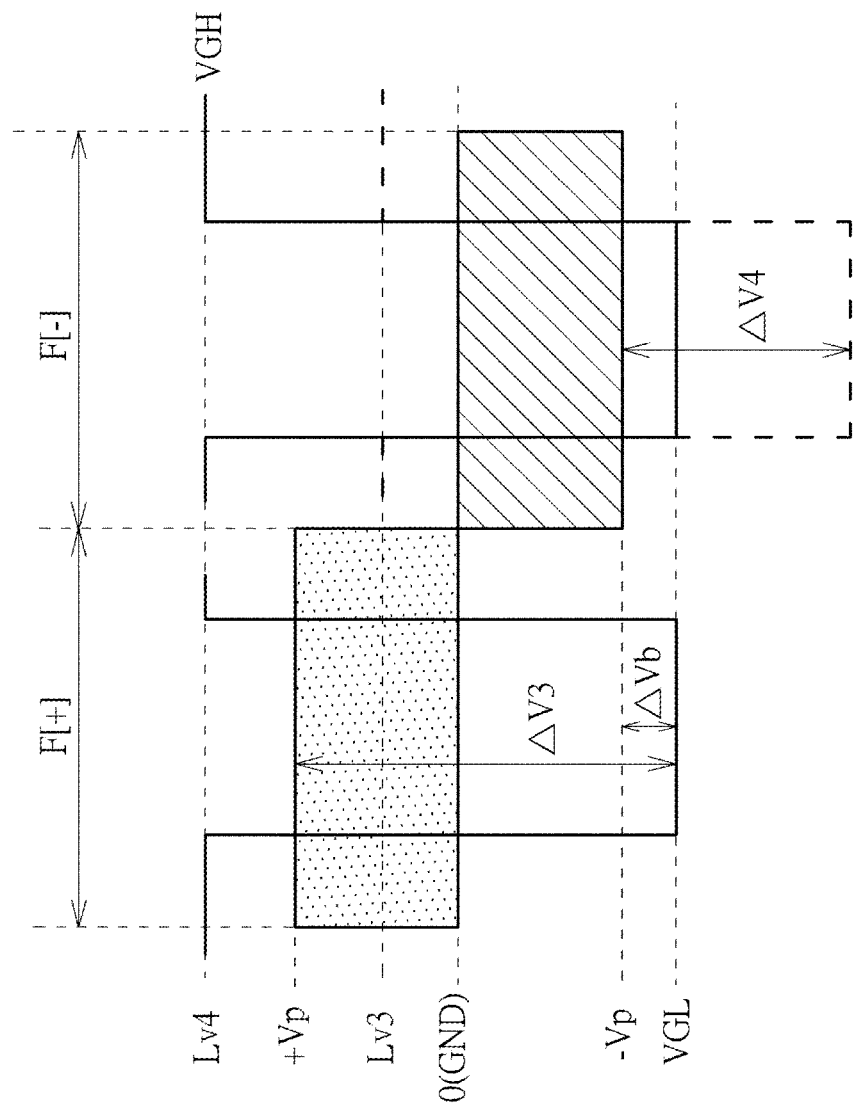
FIG. 9 is a timing diagram of electric potentials of gates of the transistors T2 and T4 in FIG. 6.

In an embodiment of the present invention, the transistors T1 to T12 are all PMOS transistors. As shown in FIG. 6, a circuit diagram of two driving units 110 and 120 for implementing the multiplexer in FIG. 1 according to another embodiment of the present invention, wherein the transistors T1 to T12 are implemented by using PMOS transistors instead. To accommodate the changes of using PMOS transistors in implementing the transistors T1 to T12, the waveforms of the switch signals SWR, SWG, SWB, XSWR, XSWG, and XSWB and the waveforms of the reset signals MUX_L1 and MUX_L2 should be changed accordingly. Please refer to FIG. 7 to FIG. 9. FIG. 7 is a timing diagram of switch signals SWR, SWG, SWB, XSWR, XSWG, and XSWB in FIG. 6; FIG. 8 is a timing diagram of a reset signal MUX_L1 and a reset signal MUX_L2 in FIG. 6; and FIG. 9 is a timing diagram of electric potentials of gates of the transistors T2 and T4 in FIG. 6. At intervals of a scan period H, the switch signals SWR, SWG, and SWB are switched in sequence from the gate high potential VGH to the gate low potential VGL, and then switched back in sequence from the gate low potential VGL to the gate high potential VGH. Similarly, at intervals of the scan period H, the switch signals XSWR, XSWG, and XSWB are switched in sequence from the gate low potential VGL to the gate high potential VGH, and then switched back in sequence from the gate high potential VGH to the gate low potential VGL. In addition, within the frame period F[+], the electric potential of the reset signal MUX_L1 is equal to a reset level Lv4, and the electric potential of the reset signal MUX_L2 is equal to a reset level Lv3; and within the frame period F[−], the electric potential of the reset signal MUX_L1 is equal to the reset level Lv3, and the electric potential of the reset signal MUX_L2 is equal to the reset level Lv4, wherein the reset level Lv4 is higher than the reset level Lv3. In this embodiment, the reset level Lv4 is the gate high potential VGH. In another embodiment of the present invention, the reset level Lv3 is higher than a ground potential GND. In another embodiment of the present invention, a voltage difference between the reset level MUX_L1 and the ground potential GND is equal to a preset voltage difference, and the above preset voltage difference is between Vth+0.5 V and Vth−0.5 V wherein Vth is an average value of the absolute values of threshold voltages of all the transistors of the driving units 110 and 120.

During the frame period F[+], when the electric potential of the switch signal SWR is equal to the gate high potential VGH, and the electric potential of the switch signal XSWR is equal to the gate low potential VGL, the transistors T1 and T3 in FIG. 6 are both turned on, such that the reset signals MUX_L1 and MUX_L2 are transmitted to the gates of the transistors T2 and T4 respectively. In this case, because the electric potentials of the reset signals MUX_L1 and MUX_L2 are the reset levels Lv4 and Lv3 respectively, biases of the reset levels Lv4 and Lv3 are applied to the respective gates of the transistors T2 and T4, so that the transistors T2 and T4 are not turned on. In this case, the voltage drops between the two terminals of the capacitor C1 and between the two terminals of the capacitor C2 are (VGH−Lv4) and (VGH−Lv3) respectively. In addition, during the frame period F[+], when the electric potential of the switch signal SWR is equal to the gate low potential VGL, and the electric potential of the switch signal XSWR is equal to the gate high potential VGH, the transistors T1 and T3 are not turned on; yet the electric potential of the gate of the transistor T2 is decreased to (Lv4−VGH+VGL) because of the coupling effect of the capacitor C1, and the electric potential of the gate of the transistor T4 is decreased to (Lv3−VGH+VGL) because of the coupling effect of the capacitor C2. As a result, the transistors T2 and T4 are both turned on and the pixel voltage signals S1 and S2 are transmitted to the data lines L1 and L2 respectively; and the electric potentials of the data lines L1 and L2 are the positive polarity pixel voltage +Vp and the negative polarity pixel voltage −Vp respectively. It is clear from the above description that when the transistors T2 and T4 are turned on because of the coupling effect of the capacitors C1 and C2, the voltage differences between the drain and the gate of the transistor T2 and between the drain and the gate of the transistor T4 are (Vp−Lv4+VGH−VGL) and (−Vp−Lv3+VGH−VGL) respectively. (−Vp−Lv3+VGH−VGL) is equal to the voltage difference ΔV4 in FIG. 9; and in the case where the reset level Lv4 is the gate high potential VGH, (Vp−Lv4+VGH−VGL) is equal to (Vp−VGL) and is also equal to the voltage difference ΔV3. Therefore, when the transistors T2 and T4 are turned on during the frame period F[+], the voltage difference between the drain and the gate of the transistor T2 is equal to ΔV3, and the voltage difference between the drain and the gate of the transistor T4 is equal to ΔV4. In comparison, if the switch signal SWR is directly transmitted to the gates of the transistors T2 and T4 without the coupling effect of the capacitors C1 and C2, when the transistor T4 is turned on, the voltage difference between the drain and the gate thereof is only (−Vp−VGL) (i.e., ΔVb) during the frame period F[+], far less than the above (−Vp−Lv3+VGH−VGL) (i.e., ΔV4). In other words, in this embodiment, the voltage difference ΔV4 between the drain and the gate of the transistor T4 is far greater than the voltage difference ΔVb generated in a traditional driving manner; therefore, with the circuit structure and the driving manner of the above embodiment of the present invention, the transistors T1 to T4 still have sufficient driving capabilities for the data lines and the sub-pixels in the case when the transistors T1 to T4 are all PMOS transistors.

Similarly, during the frame period F[−], when the electric potential of the switch signal SWR is equal to the gate high potential VGH, and the electric potential of the switch signal XSWR is equal to the gate low potential VGL, the transistors T1 and T3 in FIG. 6 are both turned on, such that the reset signals MUX_L1 and MUX_L2 are transmitted to the gates of the transistors T2 and T4 respectively. In this case, because the electric potentials of the reset signals MUX_L1 and MUX_L2 are reset levels Lv3 and Lv4 respectively, biases of the reset levels Lv3 and Lv4 are applied to the respective gates of the transistors T2 and T4, so that the transistors T2 and T4 are not turned on. In this case, the voltage drops between the two terminals of the capacitor C1 and between the two terminals of the capacitor C2 are (VGH−Lv3) and (VGL−Lv4) respectively. In addition, during the frame period F[−], when the electric potential of the switch signal SWR is equal to the gate low potential VGL, and the electric potential of the switch signal XSWR is equal to the gate high potential VGH, the transistors T1 and T3 are not turned on; yet the electric potential of the gate of the transistor T2 is decreased to (Lv4−VGH+VGL) because of the coupling effect of the capacitor C1, and the electric potential of the gate of the transistor T4 is increased to (Lv3−VGH+VGL) because of the coupling effect of the capacitor C2. As a result, the transistors T2 and T4 are both turned on and the pixel voltage signals S1 and S2 are transmitted to the data lines L1 and L2 respectively; and the electric potentials of the data lines L1 and L2 are the negative polarity pixel voltage −Vp and the positive polarity pixel voltage +Vp respectively. It is clear from the above description that when the transistors T2 and T4 are turned on because of the coupling effect of the capacitors C1 and C2, the voltage differences between the drain and the gate of the transistor T2 and between the drain and the gate of the transistor T4 are (Vp−Lv4+VGH−VGL) and (−Vp−Lv3+VGH−VGL) respectively, which are equal to the respective voltage differences ΔV4 and ΔV3. In comparison, if the switch signal SWR is directly transmitted to the gates of the transistors T2 and T4 without the coupling effect of the capacitors C1 and C2, when the transistor T2 is turned on, the voltage difference between the drain and the gate thereof is only (−Vp−VGL) (i.e., ΔVb) during the frame period F[−], far less than the above (−Vp−Lv3+VGH−VGL) (i.e., ΔV4). In other words, in this embodiment, the voltage difference ΔV4 between the drain and the gate of the transistor T2 is far greater than the voltage difference ΔVb generated in a traditional driving manner; therefore, with the circuit structure and the driving manner of the above embodiment of the present invention, the transistors T1 to T4 still have sufficient driving capabilities for the data lines and the sub-pixels in the case when the transistors T1 to T4 are all PMOS transistors.

When the transistors T1 to T12 are all PMOS transistors, both the operation manners of the capacitor C3, the transistor T5, and the transistor T6 of the driving unit 110, and of the capacitor C4, the transistor T7, and the transistor T8 of the driving unit 110 can be inferred by referring to the above operation manner of the capacitor C1, the transistor T1, and the transistor T2 in FIG. 6. In addition, both the operation manners of the capacitor C5, the transistor T9, and the transistor T10 of the driving unit 110, and of the capacitor C6, the transistor T11, and the transistor T12 of the driving unit 110 can be inferred by referring to the above operation manner of the capacitor C1, the transistor T1, and the transistor T2 in FIG. 6. Details are not described again herein.

Figure 10:
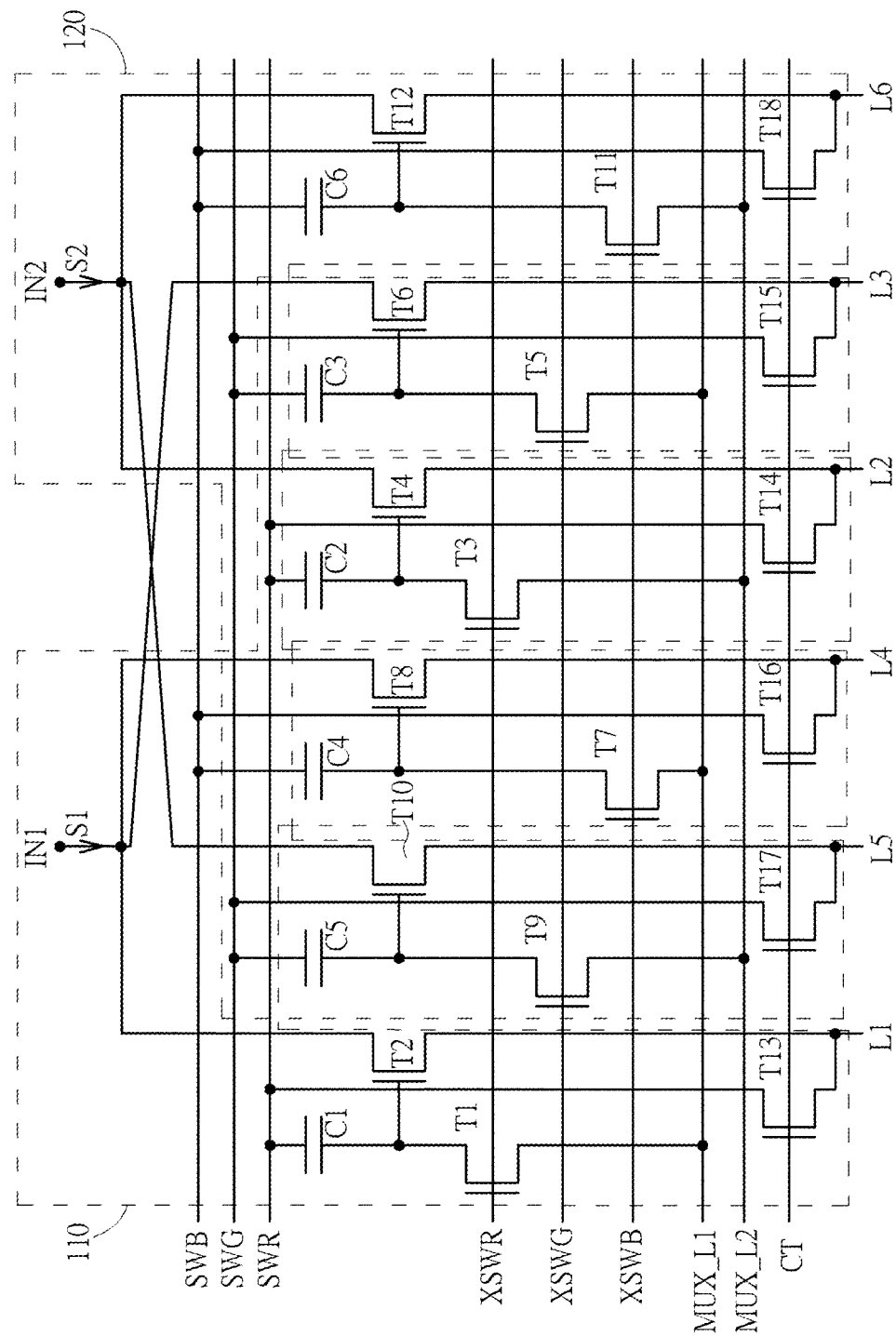
FIG. 10 is a circuit diagram of two driving units for implementing the multiplexer in FIG. 1 according to another embodiment of the present invention.

In an embodiment of the present invention, the driving unit 110 and the driving unit 120 of the multiplexer 100 may be integrated with a cell testing (CT) circuit of the display 200. Please refer to FIG. 10. FIG. 10 is a circuit diagram of two driving units 110 and 120 for implementing the multiplexer in FIG. 1 according to another embodiment of the present invention. Compared with the driving units 110 and 120 in FIG. 2, the driving unit 110 in FIG. 10 further includes a transistor T13, and the driving unit 120 in FIG. 10 further includes a transistor T14. The transistors T13 and T14 are both NMOS transistors. The transistor T13 includes a first terminal configured to receive the switch signal SWR, a second terminal coupled to the data line L1, and a control terminal configured to receive a test control signal CT. The transistor T14 includes a first terminal configured to receive the switch signal SWR, a second terminal coupled to the data line L2, and a control terminal configured to receive a test control signal CT. When a cell testing is performed on the display 200, the electric potential of the test control signal CT is increased to a high electric potential, so that the transistors T13 and T14 are turned on to transmit the switch signal SWR to the data lines L1 and L2. Meanwhile, the transistors T1 and T3 are turned on because of the switch signal XSWR, such that the transistors T2 and T4 are turned off because the biases of the reset signals MUX_L1 and MUX_L2 are being applied to the gates thereof; and during a normal period in which a cell testing is not performed, the electric potential of the test control signal CT is a low electric potential, so that the transistors T13 and T14 are not turned on. As a result, when a cell testing is performed on the display 200, the switch signal SWR is used as a pixel voltage signal to update the gray level of the sub-pixels of the display 200.

In another embodiment of the present invention, the driving unit 110 further includes transistors T13, T15, and T16, and the driving unit 120 further includes transistors T14, T17, and T18. The transistors T13 to T18 are all NMOS transistors. The transistor T13 includes a first terminal configured to receive the switch signal SWR, a second terminal coupled to the data line L1, and a control terminal configured to receive the test control signal CT. The transistor T14 includes a first terminal configured to receive the switch signal SWR, a second terminal coupled to the data line L2, and a control terminal configured to receive the test control signal CT. The transistor T15 includes a first terminal configured to receive the switch signal SWG, a second terminal coupled to a data line L3, and a control terminal configured to receive the test control signal CT. The transistor T16 includes a first terminal configured to receive the switch signal SWB, a second terminal coupled to a data line L4, and a control terminal configured to receive the test control signal CT. The transistor T17 includes a first terminal configured to receive the switch signal SWG, a second terminal coupled to a data line L5, and a control terminal configured to receive the test control signal CT. The transistor T18 includes a first terminal configured to receive the switch signal SWB, a second terminal coupled to a data line L6, and a control terminal configured to receive the test control signal CT. When a cell testing is performed on the display 200, the electric potential of the test control signal CT is increased to a high electric potential, so that the transistors T13 and T18 are turned on to transmit the switch signal SWR to the data lines L1 and L2, transmit the switch signal SWG to the data lines L3 and L4, and transmit the switch signal SWB to the data lines L5 and L6. Meanwhile, the transistors T1, T3, T5, T7, T9, and T11 are turned on because of the switch signals XSWR, XSWG, and/or XSWB, such that the transistors T2, T4, T6, T8, T10 and T12 are turned off because the biases of the reset signals MUX_L1 and/or MUX_L2 are being applied to the gates thereof. In other words, when a cell testing is performed on the display 200, the switch signals SWR, SWG, and SWB are used as pixel voltage signals to update the gray level of the sub-pixels of the display 200. In addition, it should be noted that when a cell testing is performed on the display 200, data voltage input terminals IN1 and IN2 stop inputting the pixel voltage signals S1 and S2, so that any interference to the cell testing process can be avoided.

Figure 11:
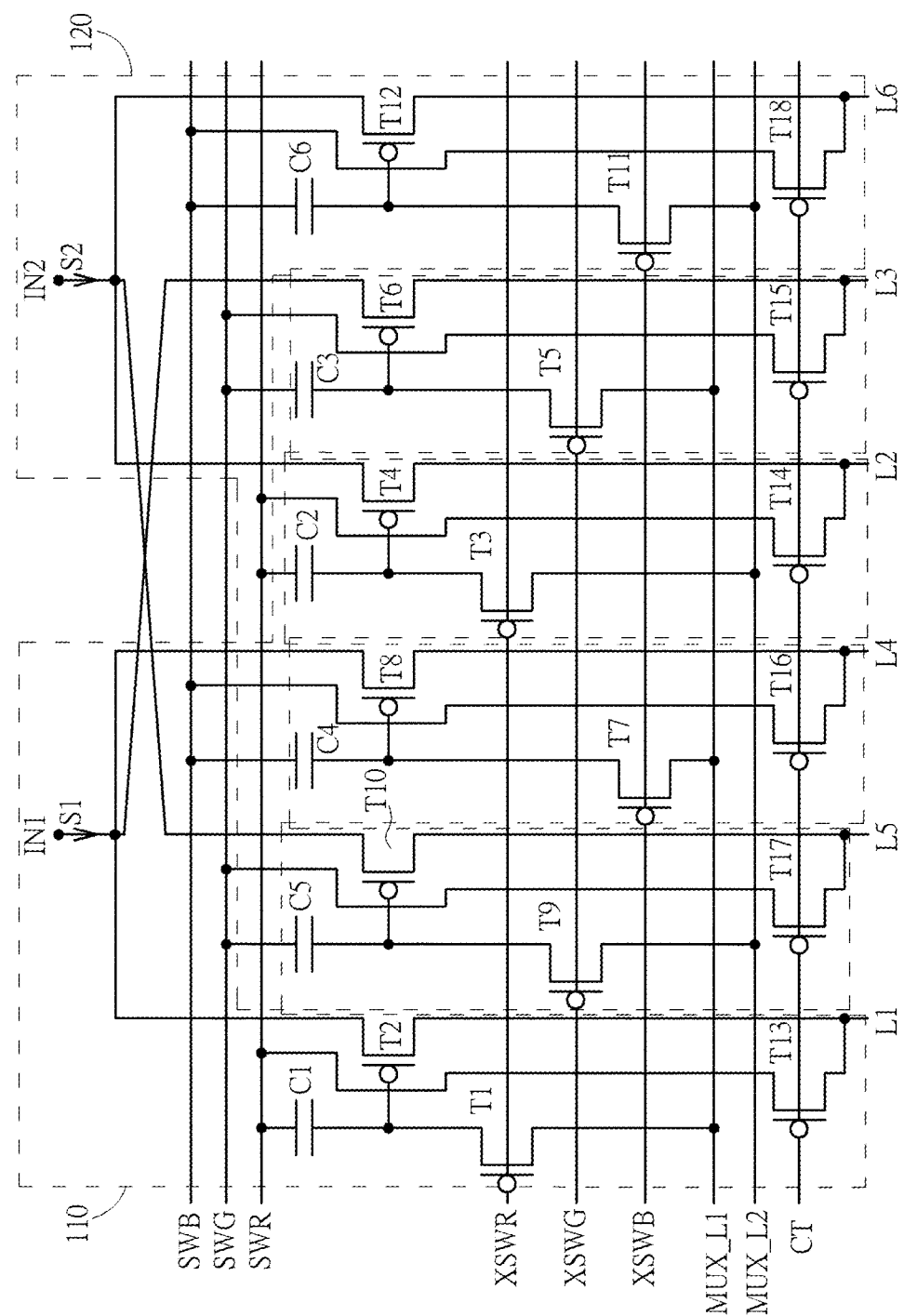
FIG. 11 is a circuit diagram of two driving units for implementing the multiplexer in FIG. 1 according to another embodiment of the present invention.

In an embodiment of the present invention, the transistors T1 to T18 in FIG. 10 may be implemented by using PMOS transistors instead. Please refer to FIG. 11, a circuit diagram of two driving units 110 and 120 for implementing the multiplexer in FIG. 1 according to another embodiment of the present invention. The difference between the driving units 110 and 120 in FIG. 11 and those in FIG. 10 is that all the transistors, T1 to T18, of the driving units 110 and 120 in FIG. 11 are PMOS transistors. When a cell testing is performed on the display 200, the electric potential of the test control signal CT is increased to a low electric potential, so that the transistors T13 and T18 are turned on to transmit the switch signal SWR to the data lines L1 and L2, transmit the switch signal SWG to the data lines L3 and L4, and transmit the switch signal SWB to the data lines L5 and L6.

Figure 12:
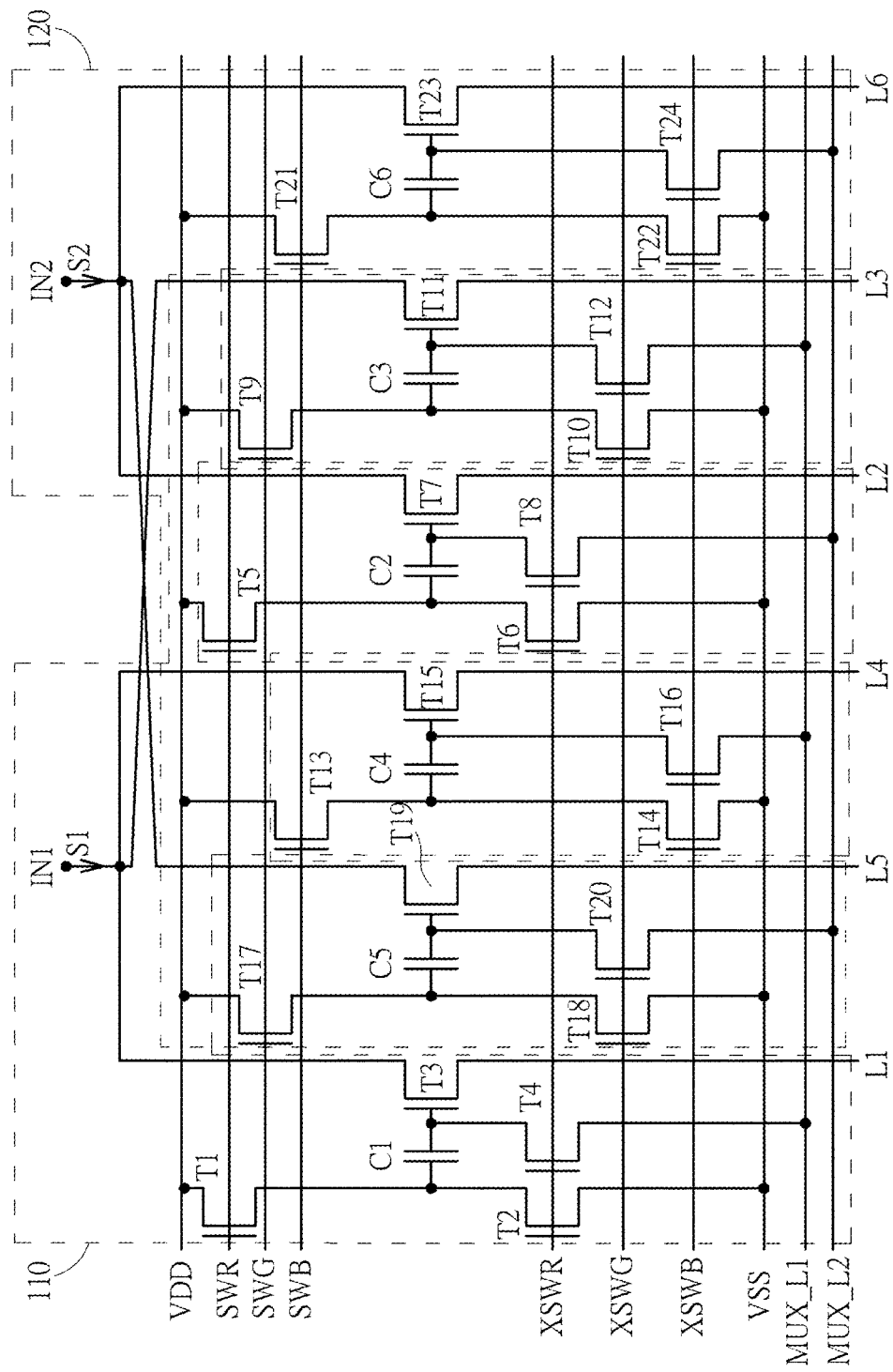
FIG. 12 is a circuit diagram of two driving units for implementing the multiplexer in FIG. 1 according to an embodiment of the present invention.

Please refer to FIG. 12. FIG. 12 is a circuit diagram of two driving units 110 and 120 for implementing the multiplexer in FIG. 1 according to an embodiment of the present invention. Each driving unit 110 includes a data voltage input terminal IN1, a transistor T1, a transistor T2, a transistor T3, a transistor T4, and a capacitor C1. The driving unit 120 includes a data voltage input terminal IN2, a transistor T5, a transistor T, a transistor T7, a transistor T8, and a capacitor C2. The data voltage input terminal IN1 is configured to receive a pixel voltage signal S1. The transistor T1 includes a first terminal, a second terminal, and a control terminal. The first terminal of the transistor T1 is configured to receive a system voltage VDD. The control terminal of the transistor T1 is configured to receive a switch signal SWR. The system voltage VDD is a positive voltage (for example, 5 V, 3 V, or a gate high voltage VGH, etc.). The transistor T2 includes a first terminal coupled to the second terminal of the transistor T1, a second terminal configured to receive a system voltage VSS, and a control terminal configured to receive a switch signal XSWR. The switch signal SWR and the switch signal XSWR have opposite phases. The system voltage VSS is lower than the system voltage VDD, and may be, for example, a ground potential (i.e., 0 V) or a gate low voltage VGL. The transistor T3 includes a first terminal, a second terminal, and a control terminal. The first terminal of the transistor T3 is coupled to the data voltage input terminal IN1, and the second terminal of the transistor T3 is coupled to a first data line. The transistor T4 includes a first terminal coupled to the control terminal of the transistor T3, a second terminal configured to receive a reset signal MUX_L1, and a control terminal configured to receive the switch signal XSWR. The capacitor C1 includes a first terminal coupled to the second terminal of the transistor T1 and the first terminal of the transistor T2, and a second terminal coupled to the control terminal of the transistor T3 and the first terminal of the transistor T4. A data voltage input terminal IN2 is configured to receive a pixel voltage signal S2, wherein the pixel voltage signal S2 and the pixel voltage signals S1 have opposite polarities. The transistor T5 includes a first terminal, a second terminal, and a control terminal. The first terminal of the transistor T5 is configured to receive the system voltage VDD, and the control terminal of the transistor T5 is configured to receive the switch signal SWR. The transistor T6 includes a first terminal coupled to the second terminal of the transistor T5, a second terminal configured to receive a system voltage VSS, and a control terminal configured to receive a switch signal XSWR. The transistor T7 includes a first terminal, a second terminal, and a control terminal. The first terminal of the transistor T7 is coupled to the data voltage input terminal IN2. The second terminal of the transistor T7 is coupled to a second data line. The transistor T8 includes a first terminal coupled to the control terminal of the transistor T7, a second terminal configured to receive a reset signal MUX_L2 and a control terminal configured to receive the switch signal XSWR. The capacitor C2 includes a first terminal coupled to both the second terminal of the transistor T5 and the first terminal of the transistor T6, and a second terminal coupled to both the control terminal of the transistor T7 and the first terminal of the transistor T8. The reset signal MUX_L1 is different from the reset signal MUX_L2. In this embodiment, a timing diagram of the switch signals SWR, SWG, SWB, XSWR, XSWG, and XSWB is FIG. 3; a timing diagram of the reset signals MUX_L1 and MUX_L2 is FIG. 4; and the transistors T1 to T8 are all NMOS transistors.

Please refer to FIG. 12 and FIG. 3 to FIG. 5. During the frame period F[+], when the electric potential of the switch signal SWR is equal to the gate low potential VGL, and the electric potential of the switch signal XSWR is equal to the gate high potential VGH, neither the transistor T1 or the transistor T5 is turned on, but the transistors T2, T4, T6, and T8 are all turned on, such that the system voltage VSS is transmitted to the first terminals of the capacitors C1 and C2, and the reset signals MUX_L1 and MUX_L2 are transmitted to the gates of the transistors T4 and T8 respectively. In this case, because the electric potentials of the reset signals MUX_L1 and MUX_L2 are the reset levels Lv1 and Lv2 respectively, biases of the reset levels Lv1 and Lv2 are applied to the respective gates of the transistors T3 and T7, so that the transistors T3 and T7 are not turned on. In this case, the voltage drops between the two terminals of the capacitor C1 and between the two terminals of the capacitor C2 are (VSS−Lv1) and (VSS−Lv2) respectively. In addition, during the frame period F[+], when the electric potential of the switch signal SWR is equal to the gate high potential VGH, and the electric potential of the switch signal XSWR is equal to the gate low potential VGL, the transistors T1 and T5 are both turned on, whereas none of the transistors T2, T4, T6, and T8 is turned on, such that the system voltage VDD is transmitted to the first terminals of the capacitors C1 and C2. In this case, the electric potential of the gate of the transistor T3 is increased to (Lv1+VDD−VSS) because of the coupling effect of the capacitor C1, and the electric potential of the gate of the transistor T7 is increased to (Lv2+VDD−VSS) because of the coupling effect of the capacitor C2. As a result, the transistors T3 and T7 are both turned on and the pixel voltage signals S1 and S2 are transmitted to the data lines L1 and L2 respectively; and the electric potentials of the data lines L1 and L2 are the positive polarity pixel voltage +Vp and the negative polarity pixel voltage −Vp respectively. It is clear from from the above description that, when the transistors T3 and T7 are turned on because of the coupling effect of the capacitors C1 and C2 the voltage differences between the gate of the transistor T3 and the data line L1 and between the gate of the transistor T7 and the data line L2 are (Lv1+VDD−VSS−Vp) and (Lv2+VDD−VSS+Vp) respectively. In comparison, if the switch signal SWR is directly transmitted to the gates of the transistors T3 and T7 without the coupling effect of the capacitors C1 and C2, when the transistor T3 is turned on, the voltage difference between the gate of the transistor T3 and the data line L1 is only (VGH−Vp) (i.e., ΔVa) during the frame period F[+]; and in the case where the difference between the system voltages VDD and VSS is great enough, the voltage difference ΔVa will be far less than the above (Lv1+VDD−VSS−Vp). In other words, in this embodiment, the voltage difference (Lv1+VDD−VSS−Vp) between the gate of the transistor T3 and the data line L1 is far greater than the voltage difference ΔVa generated in a traditional driving manner; therefore, with the circuit structure and the driving manner of the above embodiment of the present invention, the transistors T1 to T8 still have sufficient driving capabilities for the data lines and the sub-pixels in the case when the transistors T1 to T8 are all NMOS transistors.

Similarly, during the frame period F[−], when the electric potential of the switch signal SWR is equal to the gate low potential VGL, and the electric potential of the switch signal XSWR is equal to the gate high potential VGH, neither the transistor T1 or the transistor T5 in FIG. 12 is turned on, but the transistors T2, T4, T6, and T8 are all turned on, such that the system voltage VSS is transmitted to the first terminals of the capacitors C1 and C2, and the reset signals MUX_L1 and MUX_L2 are transmitted to the gates of the transistors T4 and T8 respectively. In this case, because the electric potentials of the reset signals MUX_L1 and MUX_L2 are the reset levels Lv2 and Lv1 respectively, biases of the reset levels Lv1 and Lv2 are applied to the respective gates of the transistors T3 and T7, so that the transistors T3 and T7 are not turned on. In this case, the voltage drops between two terminals of the capacitor C1 and between two terminals of the capacitor C2 are equal to (VSS−Lv2) and (VSS−Lv1), respectively. In addition, when the electric potential of the switch signal SWR is equal to the gate high potential VGH, and the electric potential of the switch signal XSWR is equal to the gate low potential VGL, both the transistors T1 and T5 are turned on, whereas none of the transistors T2, T4, T6, and T8 is turned on, such that the system voltage VDD is transmitted to the first terminals of the capacitors C1 and C2; the electric potential of the gate of the transistor T3 is increased to (Lv2+VDD−VSS) because of the coupling effect of the capacitor C1, and the electric potential of the gate of the transistor T4 is increased to (Lv1+VDD−VSS) because of the coupling effect of the capacitor C2. As a result, both the transistors T3 and T7 are turned on and the pixel voltage signals S1 and S2 are transmitted to the data lines L1 and L2 respectively; and the electric potentials of the data lines L1 and L2 are the negative polarity pixel voltage −Vp and the positive polarity pixel voltage +Vp respectively. It is clear from from the above description that, when the transistors T3 and T7 are turned on because of the coupling effect of the capacitors C1 and C2, the voltage differences between the gate of the transistor T3 and the data line L1 and between the gate of the transistor T7 and the data line L2 are (Lv2+VDD−VSS+Vp) and (Lv1+VDD−VSS−Vp) respectively. In comparison, if the switch signal SWR is directly transmitted to the gates of the transistors T3 and T7 without the coupling effect of the capacitors C1 and C2, when the transistor T7 is turned on, the voltage difference between the gate of the transistor T7 and the data line L2 is only (VGH−Vp) (i.e., ΔVa) during the frame period F[−]; and in the case where the difference between the system voltages VDD and VSS is great enough, the voltage difference ΔVa will be far less than the above (Lv1+VDD−VSS−Vp). In other words, in this embodiment, the voltage difference (Lv1+VDD−VSS−Vp) between the gate of the transistor T7 and the data line L2 may be far greater than the voltage difference ΔVa generated in a traditional driving manner; therefore, with the circuit structure and the driving manner of the above embodiment of the present invention, the transistors T1 to T8 still have sufficient driving capabilities for the data lines and the sub-pixels in the case when the transistors T1 to T8 are all NMOS transistors.

With reference to FIG. 12 and FIG. 3, in another embodiment of the present invention, each driving unit 110 in FIG. 12 may further include transistors T9 to T12, a capacitor C3, transistors T13 to T16, and a capacitor C4; and each driving unit 120 may further include transistors T17 to T20, a capacitor C5, transistors T21 to T24, and a capacitor C6. The transistor T9 includes a first terminal configured to receive a system voltage VDD, a second terminal, and a control terminal configured to receive a switch signal SWG. The transistor T10 includes a first terminal coupled to the second terminal of the transistor T9, a second terminal configured to receive a system voltage VSS, and a control terminal configured to receive a switch signal XSWG. The switch signal SWG and the switch signal XSWG have opposite phases. The transistor T11 includes a first terminal coupled to a data voltage input terminal IN1, a second terminal coupled to a data line L3, and a control terminal. The transistor T12 includes a first terminal coupled to the control terminal of the transistor T11, a second terminal configured to receive a reset signal MUX_L1, and a control terminal configured to receive a switch signal XSWG. The capacitor C3 includes a first terminal coupled to both the second terminal of the transistor T9 and the first terminal of the transistor T10, and a second terminal coupled to both the control terminal of the transistor T11 and the first terminal of the transistor T12. The transistor T13 includes a first terminal configured to receive a system voltage VDD, a second terminal, and a control terminal configured to receive a switch signal SWB. The transistor T14 includes a first terminal coupled to the second terminal of the transistor T13, a second terminal configured to receive a system voltage VSS, and a control terminal configured to receive a switch signal XSWB. The switch signal SWB and the switch signal XSWB have opposite phases. The transistor T15 includes a first terminal coupled to a data voltage input terminal IN1, a second terminal coupled to a data line L4, and a control terminal. The transistor T16 includes a first terminal coupled to the control terminal of the transistor T15, a second terminal configured to receive a reset signal MUX_L1, and a control terminal configured to receive a switch signal XSWB. The capacitor C4 includes a first terminal coupled to both the second terminal of the transistor T13 and the first terminal of the transistor T14, and a second terminal coupled to both the control terminal of the transistor T15 and the first terminal of the transistor T16. The transistor T17 includes a first terminal configured to receive a system voltage VDD, a second terminal, and a control terminal configured to receive a switch signal SWG. The transistor T18 includes a first terminal coupled to the second terminal of the transistor T17, a second terminal configured to receive a system voltage VSS, and a control terminal configured to receive a switch signal XSWG. The transistor T19 includes a first terminal coupled to a data voltage input terminal IN2, a second terminal coupled to a data line L5, and a control terminal. The transistor T20 includes a first terminal coupled to the control terminal of the transistor T19, a second terminal configured to receive a reset signal MUX_L2, and a control terminal configured to receive a switch signal XSWG. The capacitor C5 includes a first t coupled to both the second terminal of the transistor T17 and the first terminal of the transistor T18, and a second terminal coupled to both the control terminal of the transistor T19 and the first terminal of the transistor T20. The transistor T21 includes a first terminal configured to receive a system voltage VDD, a second terminal, and a control terminal configured to receive a switch signal SWB. The transistor T22 includes a first terminal coupled to the second terminal of the transistor T21, a second terminal configured to receive a system voltage VSS, and a control terminal configured to receive a switch signal XSWB. The transistor T23 includes a first terminal coupled to the data voltage input terminal IN2, a second terminal coupled to the data line L6, and a control terminal. The transistor T24 includes a first terminal coupled to the control terminal of the transistor T23, a second terminal configured to receive the reset signal MUX_L2, and a control terminal configured to receive the switch signal XSWB. The capacitor C6 includes a first terminal coupled to both the second terminal of the transistor T21 and the first terminal of the transistor T22, and a second terminal coupled to both the control terminal of the transistor T23 and the first terminal of the transistor T24.

In this embodiment, the transistors T1 to T24 in FIG. 12 are all NMOS transistors. The operation manner of the transistors T9 to T12 and the capacitor C3 of the driving unit 110 is similar to that of the transistors T1 to T4 and the capacitor C1; and the operation manner of the transistors T17 to T20 and the capacitor C5 of the driving unit 120 is similar to that of the transistors T5 to T8 and the capacitor C2. What is different is that the operations of the transistors T1 to T4 and the capacitor C1 and the operations of the transistors T5 to T8 and the capacitor C2 are controlled by the switch signals SWR and XSWR, whereas the operations of the transistors T9 to T12 and the capacitor C3 and the operations of the transistors T17 to T20 and the capacitor C5 are controlled by the switch signals SWG and XSWG instead. The rest of the operation manners remain the same. As shown in FIG. 3, the switch signals SWG and XSWG merely slightly lag behind the switch signals SWR and XSWR in terms of the time sequence, and the switch signals SWR and SWG are at the gate potential VGH at different times. Therefore, both the operation manners of the transistors T9 to T12 and the capacitor C3 of the driving unit 110 and of the transistors T17 to T20 and the capacitor C5 of the driving unit 120 can be inferred by referring to the aforementioned operation manner of the transistors T1 to T4 and the capacitor C1 and the aforementioned operation manner of the transistors T5 to T8 and the capacitor C2. Details are not described again herein.

Likewise, the operation manner of the transistors T13 to T16 and the capacitor C4 of the driving unit 110 is similar to that of the transistors T1 to T4 and the capacitor C1; and the operation manner of the transistors T21 to T24 and the capacitor C6 of the driving unit 120 is similar to that of the transistors T5 to T8 and the capacitor C2. What is different is that the operations of the transistors T1 to T4 and the capacitor C1 and the operations of the transistors T5 to T8 and the capacitor C2 are controlled by the switch signals SWR and XSWR, whereas the operations of the transistors T13 to T16 and the capacitor C4 and the operations of the transistors T21 to T24 and the capacitor C6 are controlled by the switch signals SWB and XSWB instead. The rest of the operation manners remain the same. As shown FIG. 3, the switch signals SWB and XSWB merely slightly lag behind the switch signals SWR and XSWR in terms of the time sequence, and the switch signals SWR, SWG, and SWB are at the gate potential VGH at different times. Therefore, both the operation manners of the transistors T13 to T16 and the capacitor C4 of the driving unit 110 and of the transistors T21 to T24 and the capacitor C6 of the driving unit 120 can be inferred by referring to the aforementioned operation manner of the transistors T1 to T4 and the capacitor C1 and the aforementioned operation manner of the transistors T5 to T8 and the capacitor C2. Details are not described again herein.

Figure 13:
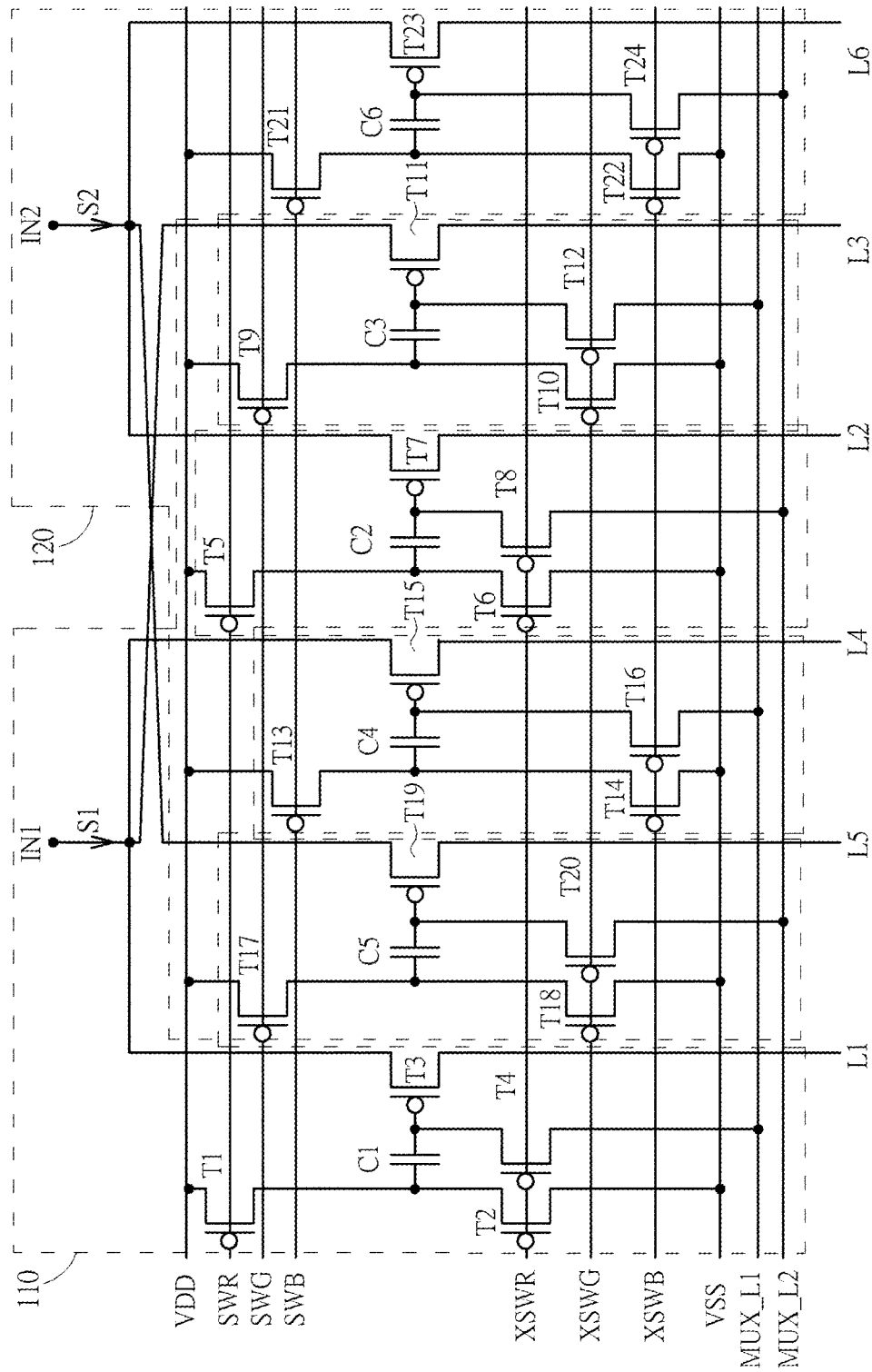
FIG. 13 is a circuit diagram of two driving units for implementing the multiplexer in FIG. 1 according to another embodiment of the present invention.

In an embodiment of the present invention, the transistors T1 to T24 in FIG. 12 may be implemented by using PMOS transistors instead. As shown FIG. 13, a circuit diagram of two driving units 110 and 120 for implementing the multiplexer in FIG. 1 according to another embodiment of the present invention, wherein the transistors T1 to T24 in FIG. 12 are implemented by using PMOS transistors instead in FIG. 13. To accommodate the changes of using PMOS transistors in implementing the transistors T1 to T24, the waveforms of the switch signals SWR, SWG, SWB, XSWR, XSWG, and XSWB and the waveforms of the reset signals MUX_L1 and MUX_L2 should be changed accordingly. In other words, the waveforms of the switch signals SWR, SWG, SWB, XSWR, XSWG, and XSWB are as shown in FIG. 7, and the waveforms of the reset signals MUX_L1 and MUX_L2 are as shown in FIG. 8.

Figure 14:
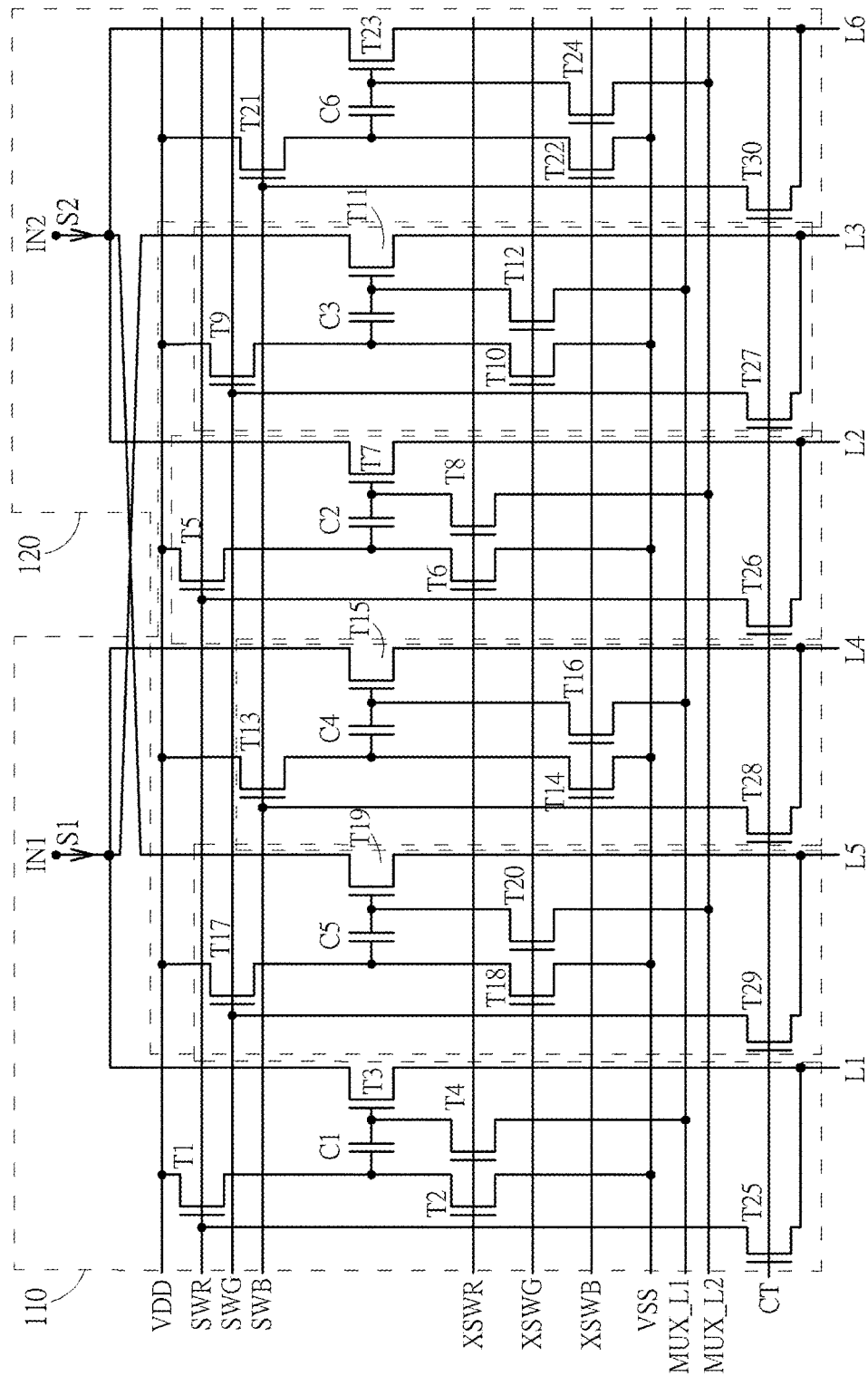
FIG. 14 is a circuit diagram of two driving units for implementing the multiplexer in FIG. 1 according to another embodiment of the present invention.

In an embodiment of the present invention, the driving unit 110 and the driving, unit 120 in FIG. 12 may be integrated with a cell testing (CT) circuit of the display 200. Please refer to FIG. 14. FIG. 14 is a circuit diagram of two driving units 110 and 120 for implementing the multiplexer in FIG. 1 according to another embodiment of the present invention. Compared with the driving units 110 and 120 in FIG. 12, the driving unit 110 in FIG. 14 further includes a transistor T25, and the driving unit 120 in FIG. 14 further includes a transistor T26. Both the transistors T25 and T26 are NMOS transistors. The transistor T25 includes a first terminal configured to receive the switch signal SWR, a second terminal coupled to the data line L1, and a control terminal configured to receive the test control signal CT. The transistor T26 includes a first terminal configured to receive the switch signal SWR, a second terminal coupled to the data line L2, and a control terminal configured to receive the test control signal CT. When a cell testing is performed on the display 200, the electric potential of the test control signal CT is increased to a high electric potential, so that the transistors T25 and T26 are turned on to transmit the switch signal SWR to the data lines L1 and L2. Meanwhile, the transistors T4 and T8 are turned on because of the switch signal XSWR, such that the transistors T3 and T7 are turned off because the biases of the reset signals MUX_L1 and MUX_L2 are being applied to the gates thereof; and during a normal period in which a cell testing is not performed, the electric potential of the test control signal CT is a low electric potential, so that the transistors T25 and T26 are not turned on. In this way, when a cell testing is performed on the display 200, the switch signal SWR is used as a pixel voltage signal, to update the gray level of the sub-pixels of the display 200.

In another embodiment of the present invention, the driving unit 110 in FIG. 14 further includes transistors T25, T27, and T28, and the driving unit 120 in FIG. 14 further includes T26, T29, and T30. The transistors T25 to T30 are all NMOS transistors. The transistor T25 includes a first terminal configured to receive the switch signal SWR, a second terminal coupled to the data line L1, and a control terminal configured to receive a test control signal CT. The transistor T26 includes a first terminal configured to receive the switch signal SWR, a second terminal coupled to the data line L2, and a control terminal configured to receive the test control signal CT. The transistor T27 includes a first terminal configured to receive the switch signal SWG, a second terminal coupled to a data line L3, and a control terminal configured to receive the test control signal CT. The transistor T28 includes a first terminal configured to receive the switch signal SWB, a second terminal coupled to a data lane L4, and a control terminal configured to receive the test control signal CT. The transistor T29 includes a first terminal configured to receive the switch signal SWG, a second terminal coupled to a data line L5, and a control terminal configured to receive the test control signal CT. The transistor T30 includes a first terminal configured to receive the switch signal SWB, a second terminal coupled to a data line L6, and a control terminal configured to receive the test control signal CT. When a cell testing is performed on the display 200, the electric potential of the test control signal CT is increased to a high electric potential, so that the transistors T13 and T18 are turned on to transmit the switch signal SWR to the data lines L1 and L2, transmit the switch signal SWG to the data lines L3 and L4, and transmit the switch signal SWB to the data lines L5 and L6. In other words, when a cell testing is performed on the display 200, the switch signals SWR, SWG, and SWB are used as pixel voltage signals, to update the gray level of the sub pixels of the display 200. Likewise, when a cell testing is performed on the display 200, data voltage input terminals IN1 and IN2 stop inputting the pixel voltage signals S1 and S2, so that any interference to the cell testing process can be avoided.

Figure 15:
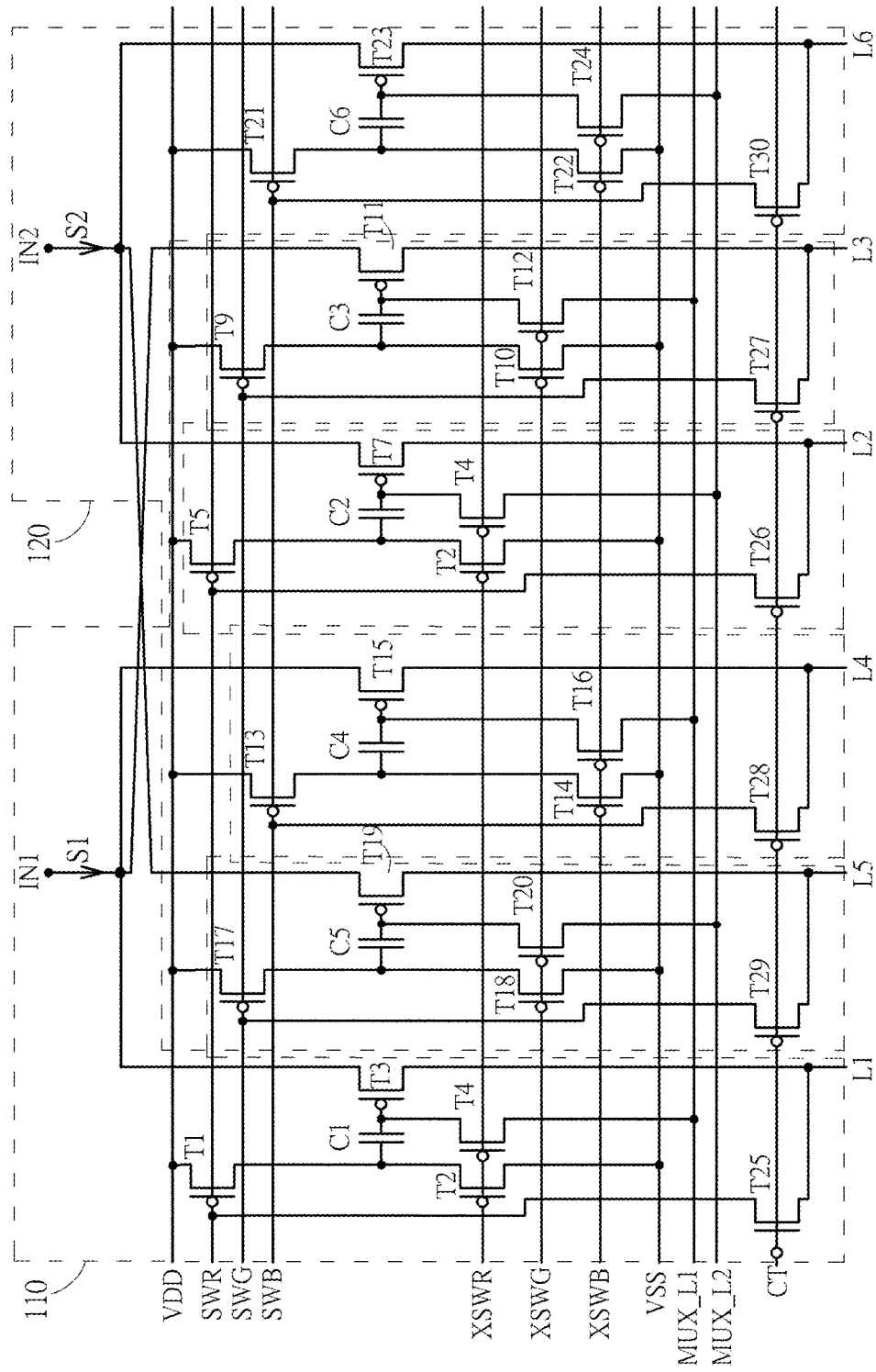
FIG. 15 is a circuit diagram of the two driving units for implementing the multiplexer in FIG. 1 according to another embodiment of the present invention.

In an embodiment of the present invention, the transistors T1 to T30 in FIG. 14 may be implemented by using PMOS transistors instead. With reference to FIG. 15, FIG. 15 is a circuit diagram of two driving units 110 and 120 for implementing the multiplexer in FIG. 1 according to another embodiment of the present invention. The difference between the driving units 110 and 120 in FIG. 15 and those in FIG. 14 is that all the transistors, T1 to T30, of the driving units 110 and 120 in FIG. 15 are PMOS transistors. When a cell testing is performed on the display 200, the electric potential of the test control signal CT is increased to a low electric potential, such that the transistors T13 and T18 are turned on, so as to transmit the switch signal SWR to the data lines L1 and L2, transmit the switch signal SWG to the data lines L3 and L4, and transmit the switch signal SWR to the data lines L5 and L6.

Through the above embodiments, two different reset signals are applied to the multiplexer of the present invention to increase an absolute value of a voltage difference between a gate and a drain of a transistor for driving a data line, thereby strengthening the driving capability of the transistor. In this way, no matter whether the transistors of the multiplexer are NMOS transistors or PMOS transistors, the multiplexer has a sufficient driving capability for data lines and sub-pixels. Therefore, the transistors of the multiplexer can all be N-Metal-Oxide-Semiconductor transistors or P-Metal-Oxide-Semiconductor transistors, thereby simplifying the process of manufacturing the multiplexer and/or a panel and improving the competitiveness of products thereof.

The above description wily provides preferred embodiments of the present invention, and all equivalent changes and modifications made according to the claims of the present invention falls within the scope of the present invention.

What is claimed is:

1. A multiplexer, comprising:
a plurality of first driving units, each of the first driving units comprising:
a first data voltage input terminal, for receiving a first pixel voltage signal;
a first capacitor, comprising:
a first terminal, for receiving a first switch signal; and
a second terminal;
a first transistor, comprising:
a first terminal, coupled to the second terminal of the first capacitor;
a second terminal, for receiving a first reset signal; and
a control terminal, for receiving a second switch signal;
wherein the first switch signal and the second switch signal have opposite phases; and
a second transistor, comprising:
a first terminal, coupled to the first data voltage input terminal;
a second terminal, coupled to a first data line; and
a control terminal, coupled to the second terminal of the first capacitor; and
a plurality of second driving units, each of the second driving units comprising:
a second data voltage input terminal, for receiving a second pixel voltage signal, wherein the first pixel voltage signal and the second pixel voltage signal have opposite polarities;
a second capacitor, comprising:
a first terminal, coupled to the first terminal of the first capacitor, and is for receiving the first switch signal; and
a second terminal;
a third transistor, comprising:
a first terminal, coupled to the second terminal of the second capacitor;
a second terminal, for receiving a second reset signal; and
a control terminal, coupled to the control terminal of the first transistor, for receiving the second switch signal; and
a fourth transistor, comprising:
a first terminal, coupled to the second data voltage input terminal;
a second terminal, coupled to a second data line; and
a control terminal, coupled to the second terminal of the second capacitor;
wherein the first reset signal is different from the second reset signal.

2. The multiplexer according to claim 1, wherein each of the first driving units further comprises:
a third capacitor, comprising:
a first terminal, for receiving a third switch signal; and
a second terminal;
a fifth transistor, comprising:
a first terminal, coupled to the second terminal of the third capacitor;
a second terminal, for receiving the first reset signal; and
a control terminal, for receiving a fourth switch signal;
wherein the third switch signal and the fourth switch signal have opposite phases;
a sixth transistor, comprising:
a first terminal, coupled to the first data voltage input terminal;
a control terminal, coupled to the second terminal of the third capacitor; and
a second terminal, coupled to a third data line;

a fourth capacitor, comprising:
a first terminal, for receiving a fifth switch signal; and
a second terminal;
a seventh transistor, comprising:
a first terminal, coupled to the second terminal of the fourth capacitor;
a second terminal, for receiving the first reset signal; and
a control terminal, for receiving a sixth switch signal, wherein the fifth switch signal and the sixth switch signal have opposite phases; and
an eighth transistor, comprising:
a first terminal, coupled to the first data voltage input terminal;
a control terminal, coupled to the second terminal of the fourth capacitor; and
a second terminal, coupled to a fourth data line;
each of the second driving units further comprises:
a fifth capacitor, comprising:
a first terminal, coupled to the first terminal of the third capacitor, for receiving the third switch signal; and
a second terminal;
a ninth transistor, comprising:
a first terminal, coupled to the second terminal of the fifth capacitor;
a second terminal, for receiving the second reset signal; and
a control terminal, coupled to the control terminal of the fifth transistor, for receiving the fourth switch signal;
a tenth transistor, comprising:
a first terminal, coupled to the second data voltage input terminal;
a control terminal, coupled to the second terminal of the fifth capacitor; and
a second terminal, coupled to a fifth data line;
a sixth capacitor, comprising:
a first terminal, coupled to the first terminal of the fourth capacitor, for receiving the fifth switch signal; and
a second terminal;
an eleventh transistor, comprising:
a first terminal, coupled to the second terminal of the sixth capacitor;
a second terminal, for receiving the second reset signal; and
a control terminal, coupled to the control terminal of the seventh transistor, for receiving the sixth switch signal; and
a twelfth transistor, comprising:
a first terminal, coupled to the second data voltage input terminal;
a control terminal, coupled to the second terminal of the sixth capacitor; and
a second terminal, coupled to a sixth data line.

3. The multiplexer according to claim 1, wherein
each of the first driving units further comprises:
a thirteenth transistor, comprising:
a first terminal, for receiving the first switch signal;
a second terminal, coupled to the first data line; and
a control terminal, for receiving a test control signal; and
each of the second driving units further comprises:
a fourteenth transistor, comprising:
a first terminal, for receiving the first switch signal;
a second terminal, coupled to the second data line; and
a control terminal, for receiving the test control signal.

4. The multiplexer according to claim 2, wherein
each of the first driving units further comprises:
a thirteenth transistor, comprising:
a first terminal, for receiving the first switch signal;
a second terminal, coupled to the first data line; and
a control terminal, for receiving a test control signal;
a fifteenth transistor, comprising:
a first terminal, for receiving the third switch signal;
a second terminal, coupled to the third data line; and
a control terminal, for receiving the test control signal; and
a sixteenth transistor, comprising:
a first terminal, for receiving the fifth switch signal;
a second terminal, coupled to the fourth data line; and
a control terminal, for receiving the test control signal; and
each of the second driving units further comprises:
a fourteenth transistor, comprising:
a first terminal, for receiving the first switch signal;
a second terminal, coupled to the second data line; and
a control terminal, for receiving the test control signal;
a seventeenth transistor, comprising:
a first terminal, for receiving the third switch signal;
a second terminal, coupled to the fifth data line; and
a control terminal, for receiving the test control signal; and
an eighteenth transistor, comprising:
a first terminal, for receiving the fifth switch signal;
a second terminal, coupled to the sixth data line; and
a control terminal, for receiving the test control signal.

5. The multiplexer according to claim 1, wherein all the transistors of the first driving unit and the second driving unit are N-type metal-oxide-semiconductor transistors.

6. The multiplexer according to claim 1, wherein the multiplexer is for a display, and during a $N^{th}$ frame period of the display, an electric potential of the first reset signal is higher than the electric potential of the second reset signal, and N is a positive integer; and
wherein during the $(N+1)^{th}$ frame period of the display, the electric potential of the first reset signal is lower than the electric potential of the second reset signal.

7. The multiplexer according to claim 2, wherein the fifth data line is between the first and the fourth data lines, the fourth data line is between the fifth and the second data lines, the second data line is between the fourth and the third data lines, and the third data line is between the second and the sixth data lines.

8. A method for driving the multiplexer according to claim 1, wherein the multiplexer is used for a display, and all the transistors of the first driving unit and the second driving unit are N-type metal-oxide-semiconductor transistors, the method comprising:
during the $n^{th}$ frame period of the display, making the first pixel voltage signal to have a first polarity, making the second pixel voltage signal to have a second polarity, making the first reset signal to have an electric potential at a first reset level, and making the second reset signal to have an electric potential at a second reset level, wherein n is a positive integer, the first polarity is different from the second polarity, and the second reset level is lower than the first reset level; and
during the $(n+1)^{th}$ frame period of the display, making the first pixel voltage signal to have the second polarity, making the second pixel voltage signal to have the first polarity, making the first reset signal to have the electric potential at the second reset level, and making the second reset signal to have the electric potential at the first reset level.

9. The method according to claim 8, wherein the method further comprises:

setting the first reset level to be lower than a ground potential.

10. The method according to claim 9, wherein the method further comprises:

making a voltage difference between the ground potential and the first reset level to be equal to a preset voltage difference, wherein the preset voltage difference is between Vth+0.5 V and Vth−0.5 V, and Vth being an average value of threshold voltages of all the transistors in the first driving unit and the second driving unit.

11. The method according to claim 8, wherein the first switch signal and the second switch signal are respective square waves having electric potentials switched between a gate high potential and a gate low potential, and the second reset level equals to the gate low potential.

* * * * *